(12) United States Patent
Sangawa

(10) Patent No.: US 7,573,352 B2
(45) Date of Patent: Aug. 11, 2009

(54) DUAL-FREQUENCY MATCHING CIRCUIT

(75) Inventor: Ushio Sangawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/352,331

(22) Filed: Jan. 12, 2009

(65) Prior Publication Data

US 2009/0121962 A1    May 14, 2009

Related U.S. Application Data

(63) Continuation of application No. PCT/JP2008/002353, filed on Aug. 28, 2008.

(30) Foreign Application Priority Data

Aug. 29, 2007    (JP)    ............................ 2007-222413

(51) Int. Cl.
   *H03H 7/38*    (2006.01)
(52) U.S. Cl. ......................................... 333/32; 333/126
(58) Field of Classification Search .................. 333/32, 333/33, 126
   See application file for complete search history.

(56) References Cited

U.S. PATENT DOCUMENTS

| 5,493,311 | A | 2/1996 | Itoh et al. | |
|---|---|---|---|---|
| 6,331,815 | B1 | 12/2001 | Oshima et al. | |
| 6,621,376 | B2 * | 9/2003 | Liu et al. | ..................... 333/126 |
| 2005/0270118 | A1 | 12/2005 | Shannon | |
| 2006/0261911 | A1 | 11/2006 | Fukuda et al. | |

FOREIGN PATENT DOCUMENTS

JP    57-46384    3/1982

(Continued)

OTHER PUBLICATIONS

Robert E. Collin., "Impedance Transformation and Matching", An IEEE Press Classic Reissue Foundations for Microwave Engineering, Second Edition, IEEE Press Series on Electromagnetic Wave Theory, pp. 319-325, A John Wiley & Sons, Inc., Publication, New York, USA.

(Continued)

*Primary Examiner*—Stephen E Jones
(74) *Attorney, Agent, or Firm*—McDermott Will & Emery LLP

(57) ABSTRACT

The connection topology of input terminals (2), elements (4a, 4b, 4c and 4d) and load (5) is designed similarly to a "seven-segment display" that is often used to display numerals on a calculator or a digital watch. Specifically, suppose in the three horizontally running segments of the seven-segment display, the top and bottom ones are associated with the input terminals (2) and the load (5) is allocated to the other horizontal one. Then, the other four vertical segments are associated with the elements (4a, 4b, 4c and 4d), which may be an inductor with an inductance of 2.521 nH, an inductor with an inductance of 76.157 nH, an inductor with an inductance of 1.907 nH, and a capacitor with a capacitance of 1.429 pF, respectively. By adopting this circuit configuration, the total number of elements can be reduced to four and the loss can be reduced significantly. Since the resonant circuits can be eliminated and the size of the ladder circuit can be reduced, impedance matching is achieved with a high degree of stability in spite of a variation in the impedance of the load (5).

3 Claims, 22 Drawing Sheets

1 DUAL-FREQUENCY MATCHING CIRCUIT OF THIS INVENTION

FOREIGN PATENT DOCUMENTS

| | | |
|---|---|---|
| JP | 57-46385 | 3/1982 |
| JP | 06-252791 | 9/1994 |
| JP | 2000-077964 | 3/2000 |
| JP | 2004-242269 | 8/2004 |
| JP | 2006-325153 | 11/2006 |

OTHER PUBLICATIONS

Co-pending U.S. Application: Continuation Application of PCT/JP2008/002351, filed on Jan. 12, 2009.
Co-pending U.S. Application: Continuation Application of PCT/JP20081002348, filed on Jan. 12, 2009.
Co-pending U.S. Application: Continuation Application of PCT/JP2008/002349, filed on Jan. 12, 2009.
Co-pending U.S. Application: Continuation Application of PCT/JP2008/002350, filed on Jan. 12, 2009.
Co-pending U.S. Application: Continuation Application of PCT/JP2008/002352, filed on Jan. 12, 2009.
U.S. Appl. No. 12/261,576, filed on Oct. 30, 2008.
U.S. Appl. No. 12/261,605, filed on Oct. 30, 2008.

* cited by examiner

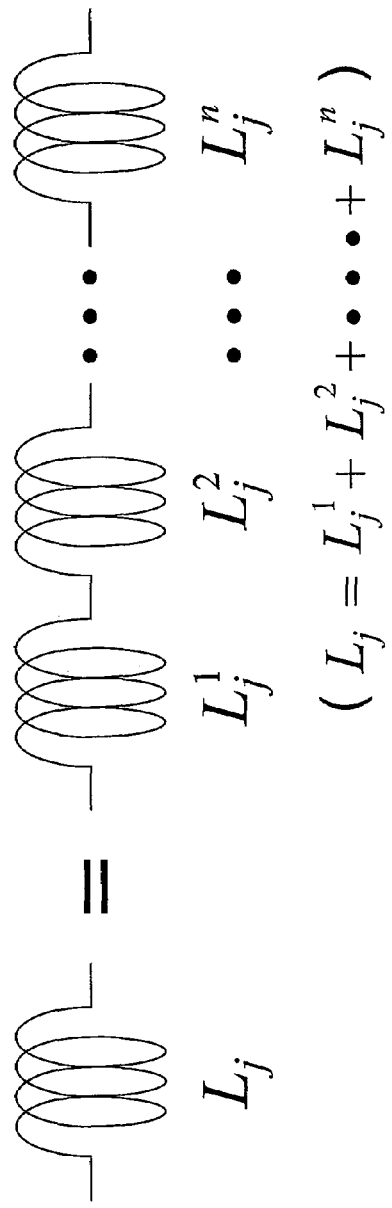

FIG. 6

| Case | ELEMENT CONFIGURATION | | | | ELEMENT CONSTANT (L: [nH], C: [pF]) | | | |
|---|---|---|---|---|---|---|---|---|
| | $\alpha_1$ | $\alpha_2$ | $\alpha_3$ | $\alpha_4$ | $\alpha_1$ | $\alpha_2$ | $\alpha_3$ | $\alpha_4$ |
| 1 | L | L | L | C | 12.084 | 5.452 | 14.508 | 1.934 |
| 2 | C | L | C | L | 1.023 | 5.772 | 0.904 | 14.927 |

FIG. 8

| Case | ELEMENT CONFIGURATION | | | | BANDWIDTH CHANGE RATIO [%] | |
|---|---|---|---|---|---|---|
| | $\alpha_1$ | $\alpha_2$ | $\alpha_3$ | $\alpha_4$ | 0.85 GHz | 1.86 GHz |
| 1 | L | L | L | C | -4.579 | 17.714 |
| 2 | C | L | C | L | -2.091 | 16.701 |

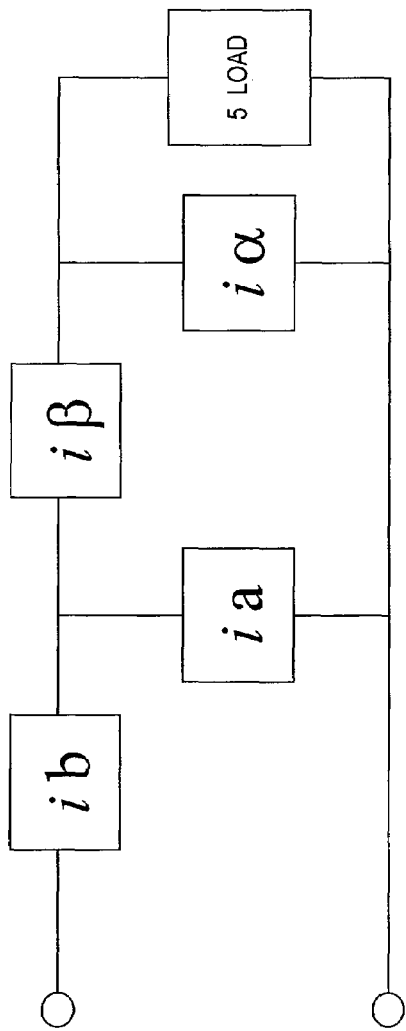
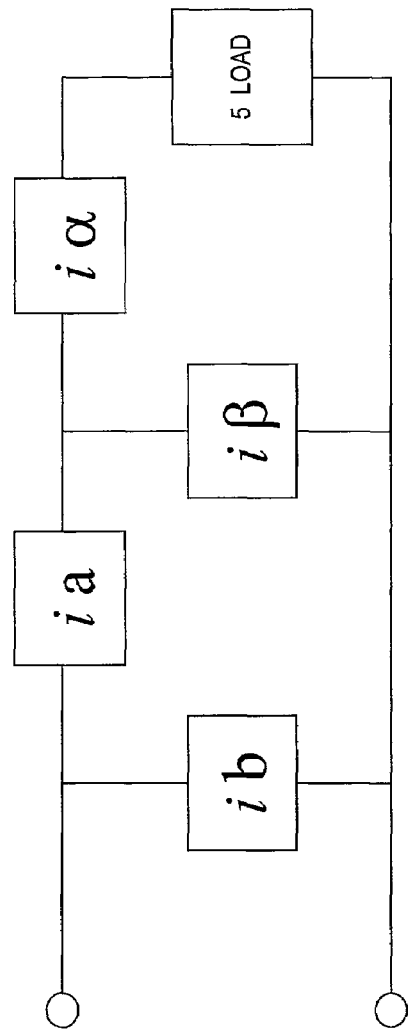
FIG. 9A
FIG. 9B

FIG. 10A

NO SOLUTIONS

FIG. 10B

| Case | ELEMENT CONFIGURATION | | | | ELEMENT CONSTANT (L: [nH], C: [pF]) | | | | BANDWIDTH CHANGE RATIO [%] | |
|---|---|---|---|---|---|---|---|---|---|---|
| | a | b | α | β | a | b | α | β | 0.88 GHz | 1.86 GHz |
| 1 | C | L | L | L | 2.312 | 8.003 | 1.348 | 9.636 | -6.466 | 18.038 |
| 2 | C | C | L | L | 4.152 | 1.806 | 5.992 | 13.142 | -4.154 | 17.695 |

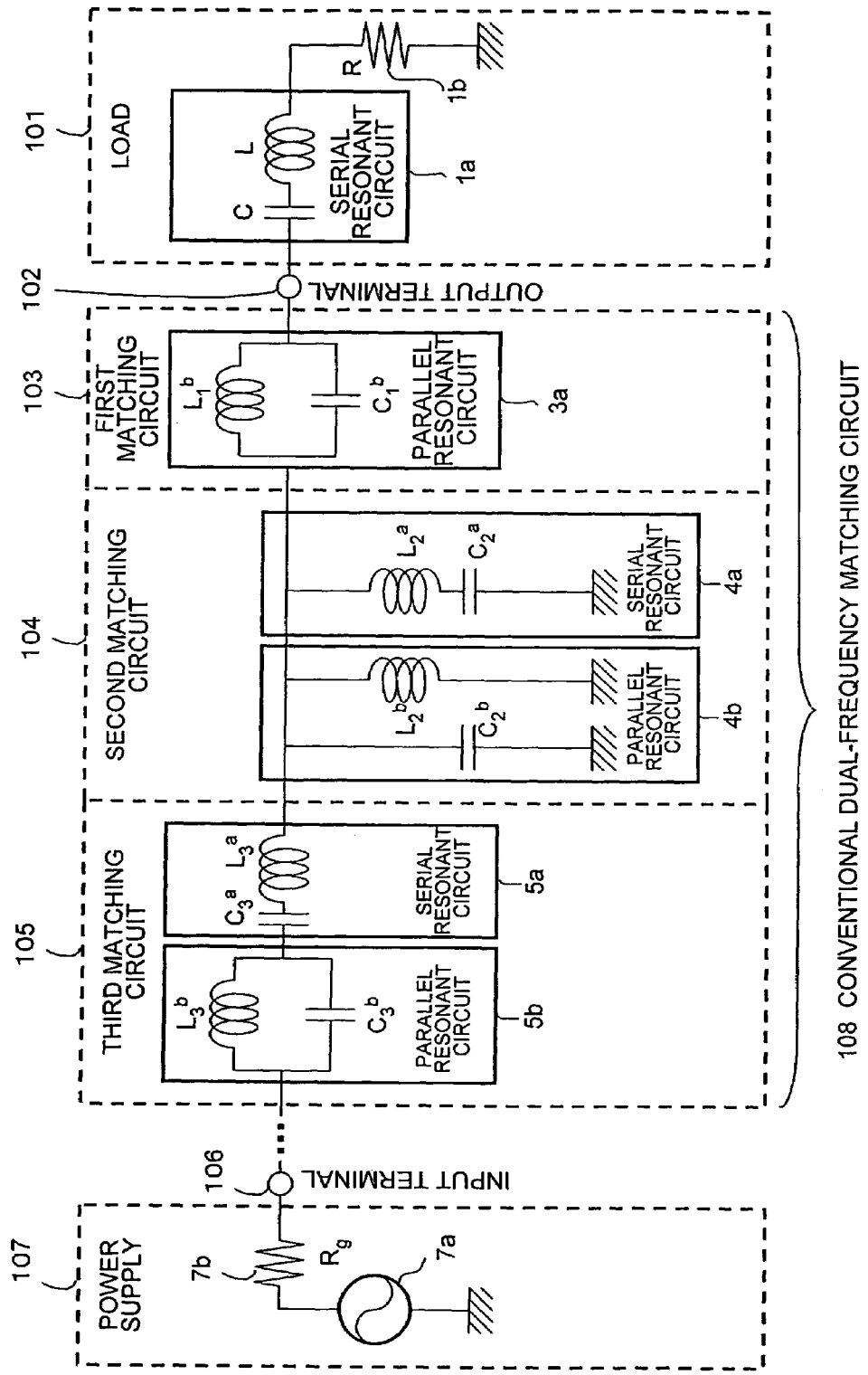
FIG. 11 – PRIOR ART –

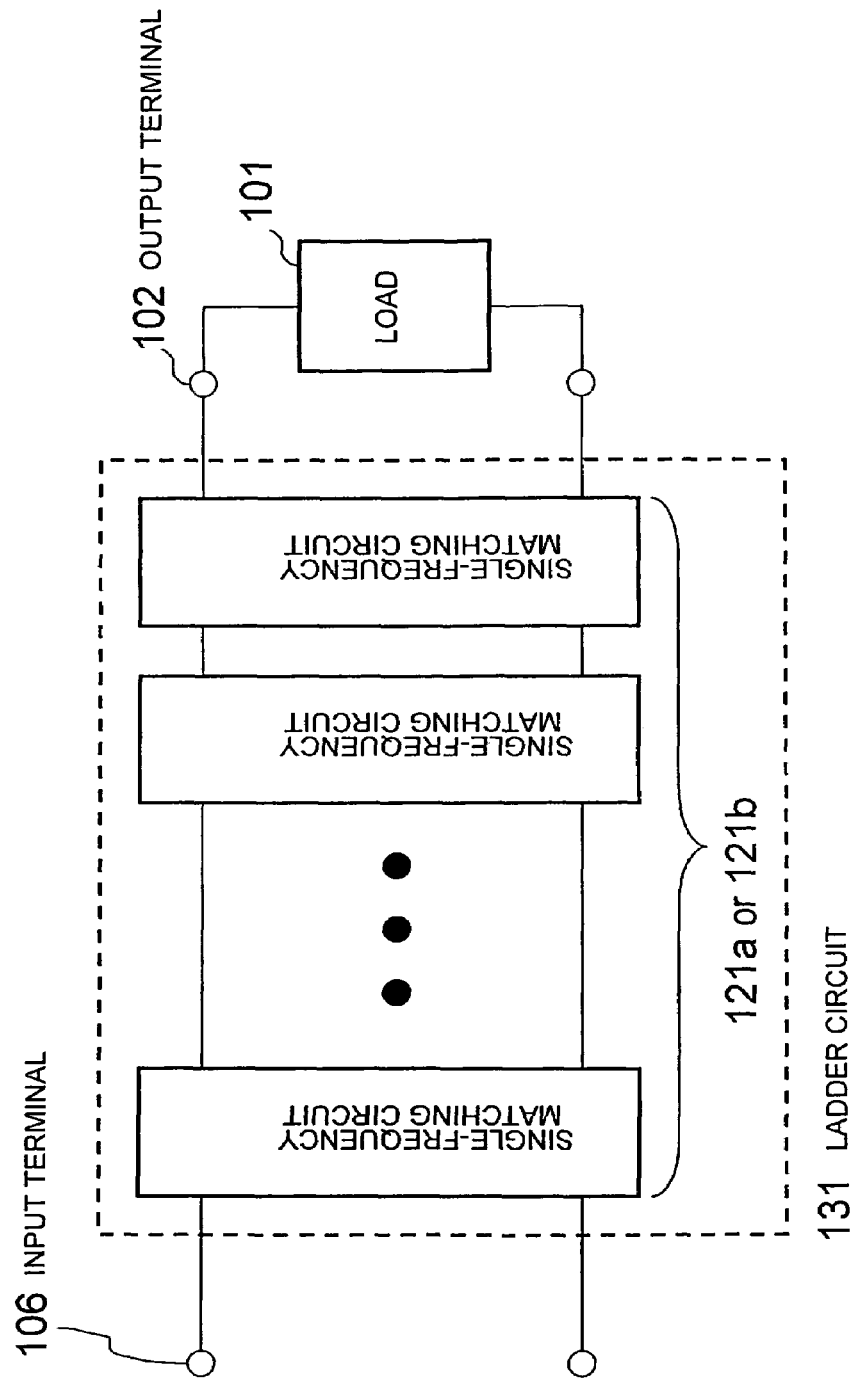
FIG. 13 – PRIOR ART –

ANTENNA RESONANT FREQUENCIES: 0.85 to 2.05 GHz

FIG. 20

| ELEMENT CONFIGURATION | | | | ELEMENT CONSTANT (L: [nH], C: [pF]) | | | |
|---|---|---|---|---|---|---|---|
| $\alpha_1$ | $\alpha_2$ | $\alpha_3$ | $\alpha_4$ | $\alpha_1$ | $\alpha_2$ | $\alpha_3$ | $\alpha_4$ |
| L | L | L | C | 4.030 | 11.208 | 2.497 | 2.233 |

ANTENNA RESONANT FREQUENCIES: 0.85 to 1.55 GHz

FIG. 21

| ELEMENT CONFIGURATION | | | | ELEMENT CONSTANT (L: [nH], C: [pF]) | | | |
|---|---|---|---|---|---|---|---|
| $\alpha_1$ | $\alpha_2$ | $\alpha_3$ | $\alpha_4$ | $\alpha_1$ | $\alpha_2$ | $\alpha_3$ | $\alpha_4$ |
| L | L | L | C | 2.132 | 8.266 | 0.596 | 2.097 |

ANTENNA RESONANT FREQUENCIES: 0.85 to 1.7 GHz

FIG. 22

| ELEMENT CONFIGURATION | | | | ELEMENT CONSTANT (L: [nH], C: [pF]) | | | |
|---|---|---|---|---|---|---|---|
| $\alpha_1$ | $\alpha_2$ | $\alpha_3$ | $\alpha_4$ | $\alpha_1$ | $\alpha_2$ | $\alpha_3$ | $\alpha_4$ |
| L | L | L | C | 2.521 | 76.157 | 1.907 | 1.429 |

ANTENNA RESONANT FREQUENCIES: 0.85 to 2.05 GHz

US 7,573,352 B2

DUAL-FREQUENCY MATCHING CIRCUIT

This is a continuation of International Application No. PCT/JP2008/002353, with an international filing date of Aug. 28, 2008, which claims priority of Japanese Patent Application No. 2007-222413, filed on Aug. 29, 2007, the contents of which are hereby incorporated by reference.

BACKGROUND OF THE INVENTION

1. Field of the Invention

The present invention relates to a dual-frequency impedance matching circuit to be inserted between an antenna and an RF circuit in a mobile terminal in order to carry out impedance matching between the antenna and the RF circuit in two arbitrary frequency bands.

2. Description of the Related Art

As cellphone services have become amazingly popular nowadays, there are increasing demands for an even higher degree of mobility and even more versatile telecommunications services. To meet such demands, it is now one of the major technological objects to develop a mobile terminal that has an even smaller size and yet can use multiple telecommunications systems that are currently operating on mutually different frequency bands (such a device is called a "multi-band device"). Quite the same object is shared by an antenna that is an important device operating as a radio wave input/output interface. That is to say, development of an even smaller antenna operating on multiple different frequency bands (which is called a "multi-band antenna") is awaited.

In actually developing a mobile terminal, however, it is extremely difficult to realize good antenna properties on multiple desired frequency bands just by optimizing the configuration of the antenna. That is why the final frequency adjustment and good impedance matching with an RF circuit often get done by inserting an appropriate matching circuit between the antenna and the RF circuit. Currently, the frequency bands utilized by various cellphone services are in 800-900 MHz range and 1.5-2 GHz range. To realize a multi-band mobile terminal, its antenna should operate on both of these two frequency bands. However, these two frequency bands are so far apart from each other that it is difficult for a normal single-frequency matching circuit to carry out flexible matching and adjustment on both of these two frequency bands. That is why to achieve the object described above, it is preferable to apply a dual-frequency matching circuit that can carry out independent matching on those two frequency bands.

In such a background, some conventional dual-frequency matching circuits that have been adopted so far include a ladder circuit consisting of multiple single-frequency matching circuits and multiple resonant circuits (see Japanese Patent Application Laid-Open Publication No. 2004-242269 (page 18 and FIG. 1) and Japanese Patent Application Laid-Open Publication No. 2006-325153 (page 14 and FIG. 1), for example). FIG. 11 is a circuit block diagram illustrating a circuit configuration for a conventional dual-frequency matching circuit disclosed in Japanese Patent Application Laid-Open Publication No. 2004-242269 (page 18 and FIG. 1).

In FIG. 11, the frequency dependency of impedance (or a single-terminal S parameter) at an output terminal 102 is already known and a load 101 corresponds to an antenna in the situation described above. And the load 101 is connected to a power supply 107 by way of a conventional dual-frequency matching circuit 108 consisting of first, second and third matching circuits 103, 104 and 105. As shown in the block diagrams in FIG. 11, these matching circuits 103, 104 and 105 are parallel or serial resonant circuits, each of which is made up of inductors and capacitors.

The conventional dual-frequency matching circuit 108 shown in FIG. 11 operates as an impedance transformer such that in two desired frequency bands, the circuit 108 transforms the impedance of the load 101 at the output terminal 102 into the impedance value of the power supply 107 at the input terminal 106. That is why in those two frequency bands, the power supplied from the power supply 107 can be passed to the load 101 efficiently without experiencing reflection attenuation.

Consider each of these three matching circuits 103, 104 and 105 as a single circuit block. In that case, the conventional dual-frequency matching circuit 108 shown in FIG. 11 is composed of the two fundamental types of single-frequency matching circuits 121a and 121b shown in FIG. 12 (see Robert E. Collin, —An IEEE Press Classic Reissue—Foundations for Microwave Engineering (Second Edition, IEEE Press Series on Electromagnetic Wave Theory), A John Wiley & Sons, Inc., Publication, ISBN 0-7803-6031-1 (page 323, FIG. 5.17) (hereinafter, Non-Patent Document No. 1), for example), and they are coupled together so as to form a ladder circuit 131 as shown in FIG. 13. FIG. 12 illustrates circuit block diagrams showing the circuit configurations of the two fundamental types of single-frequency matching circuits disclosed in Non-Patent Document No. 1 and FIG. 13 is a circuit block diagram illustrating the circuit configuration of a ladder circuit for use in a conventional dual-frequency matching circuit. It should be noted that the ladder circuit 131 is a circuit configuration that is ordinarily used in various types of filters.

The function of the conventional dual-frequency matching circuit 108 is equivalent to transmitting an RF signal from the input terminal 106 to the load 101 on two desired frequency bands without causing any reflection attenuation. That is why by adopting the ladder circuit 131 shown in FIG. 13, designing a dual-frequency matching circuit is equivalent to designing a band-pass filter, of which the pass bands are those two desired frequency bands. Consequently, in designing the conventional dual-frequency matching circuit 108, the conventional filter designing method can be used effectively, and matching with the input terminal 106 can be done relatively flexibly on two desired frequency bands without depending on the frequency response of the impedance at the load 101. These are advantages of the conventional configuration.

However, the conventional configuration has the following two drawbacks.

Firstly, it is difficult to reduce the loss caused by the dual-frequency matching circuit. To improve the quality of cellphone services, the transmission and receiving properties of mobile terminals must be improved. The transmission and receiving properties are improved mainly by reducing the transmission loss between the antenna and the RF circuit. That is why the loss to be caused by the dual-frequency matching circuit inserted there is preferably as little as possible. The conventional configuration, however, needs too many elements (including inductors and capacitors) and must use a number of resonant circuits, and therefore, is a problem as far as loss reduction is concerned.

Another problem is that it is difficult to stabilize the matching property with respect to the variation in the impedance of the load 101. Normally, when a mobile terminal is used, the user's hand or head comes close to the antenna. That is why the frequency dependency of the impedance for the antenna is affected by how the device is used. For that reason, to ensure stabilized transmission and receiving quality, the matching property must be stabilized with respect to the variation in the impedance of the antenna. However, since the conventional circuit described above includes a lot of resonant circuits, of which the electrical properties (represented by a two-terminal S parameter) vary steeply with the frequency, the matching property is easily affected by the variation in the impedance of the load 101. Furthermore, in the ladder circuit 131, the impedance is transformed in each single-frequency matching circuit 121a, 121b (see FIG. 12) and the ladder circuit is composed of a number of such single-frequency matching circuits. That is why the ladder circuit itself is sensitive to the variation in the impedance of the load 101. In view of these considerations, the conventional configuration described above is still to be improved in terms of stability, too.

In order to overcome the problems described above, the present invention has an object of providing a dual-frequency matching circuit that causes little loss and that achieves high stability with respect to a variation in the impedance of a load.

SUMMARY OF THE INVENTION

A dual-frequency matching circuit according to the present invention includes: first and second input terminals that receive a first RF signal with a frequency of 0.85 GHz and a second RF signal with a frequency of 2.05 GHz, respectively, from an RF circuit with an impedance of 50 Ω; first and second output terminals that are connected to an antenna; and a group of circuit elements that are connected between the input terminals and the output terminals. The group of circuit elements includes first, second, third and fourth elements. The first and fourth elements are connected in series between the first and second input terminals and the second and third elements are connected in series between the first and second input terminals. The first output terminal is connected to a connection node between the first and fourth elements. The second output terminal is connected to a connection node between the second and third elements. The first element is an inductor with an inductance of 2.521 nH. The second element is an inductor with an inductance of 76.157 nH. The third element is an inductor with an inductance of 1.907 nH. And the fourth element is a capacitor with a capacitance of 1.429 pF.

In one preferred embodiment, the impedance of the antenna is 54.4−8.3i Ω (where i is an imaginary unit) at a frequency of 0.85 GHz and 50.4+8.2i Ω (where i is an imaginary unit) at a frequency of 2.05 GHz, respectively.

In a specific preferred embodiment, the antenna is an inverted F antenna to be built in a cellphone.

The dual-frequency matching circuit of the present invention can resolve the two major technological issues (i.e., loss reduction and stabilization of matching property).

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3A is a circuit diagram illustrating how to expand an inductor (that is a single constituent element of the dual-frequency matching circuit of the first preferred embodiment of the present invention) into a circuit consisting of multiple inductors, and FIG. 3B is a circuit diagram illustrating how to expand a capacitor (that is a single constituent element of the dual-frequency matching circuit of the first preferred embodiment of the present invention) into a circuit consisting of multiple capacitors.

FIG. 4 illustrates perspective view showing the dimensions of an analytical model for a mobile terminal with an antenna as a specific example of the first preferred embodiment of the present invention. Specifically.

FIG. 5 shows the frequency dependency of the radio frequency properties of the analytical model shown in FIG. 4 at the output terminals 3 with an impedance of 50 Ω in the specific example of the first preferred embodiment of the present invention. Specifically.

FIG. 6 is a table of element constants in the dual-frequency matching circuit of the present invention that was designed for the analytical model shown in FIG. 4 in the specific example of the first preferred embodiment of the present invention.

FIG. 8 is a table showing the change ratios of the impedance matching bandwidth of the dual-frequency matching circuits of the present invention, which were designed as shown in FIG. 6, in this specific example of the first preferred embodiment of the present invention, when a hand came close to the mobile terminal as shown in FIG. 7.

FIG. 9 shows block diagrams of conventional dual-frequency matching circuits. Specifically, FIG. 9A is a block diagram of a dual-frequency matching circuit based on the single-frequency matching circuit disclosed in Non-Patent Document No. 1 shown in FIG. 12A. On the other hand, FIG. 9B shows a dual-frequency matching circuit based on the single-frequency matching circuit disclosed in Non-Patent Document No. 1 shown in FIG. 12B.

FIG. 10A shows that there are no solutions for the element configurations, element constants of the conventional dual-frequency matching circuits and bandwidth change ratios of the matching bands when a hand comes close to them, and FIG. 10B is a table showing the element configurations, element constants of the conventional dual-frequency matching circuits and bandwidth change ratios of the matching bands when a hand comes close to the mobile terminal. Specifically, FIG. 10B shows a table that was calculated for the circuit blocks shown in FIG. 9B.

FIG. 11 is a circuit block diagram illustrating a circuit configuration for a conventional dual-frequency matching circuit.

FIG. 13 is a circuit block diagram illustrating the circuit configuration of a ladder circuit for use in a conventional dual-frequency matching circuit.

FIG. 17A shows the frequency dependency of a voltage standing wave ratio and FIG. 17B is a Smith chart of the single-terminal S parameters.

FIG. 18A shows the frequency dependency of a voltage standing wave ratio and FIG. 18B is a Smith chart of the single-terminal S parameters.

FIG. 19A shows the frequency dependency of a voltage standing wave ratio and FIG. 19B is a Smith chart of the single-terminal S parameters.

FIG. 20 is a table of element configuration and element constants in the dual-frequency matching circuit of the present invention that was designed for the analytical model shown in FIG. 14 in the second specific example of the first preferred embodiment of the present invention.

FIG. 21 is a table of element configuration and element constants in the dual-frequency matching circuit of the present invention that was designed for the analytical model shown in FIG. 15 in the second specific example of the first preferred embodiment of the present invention.

FIG. 22 is a table of element configuration and element constants in the dual-frequency matching circuit of the present invention that was designed for the analytical model shown in FIG. 16 in the second specific example of the first preferred embodiment of the present invention.

DETAILED DESCRIPTION OF PREFERRED EMBODIMENTS

Hereinafter, preferred embodiments of the present invention will be described with reference to the accompanying drawings.

Embodiment

Figure 1:
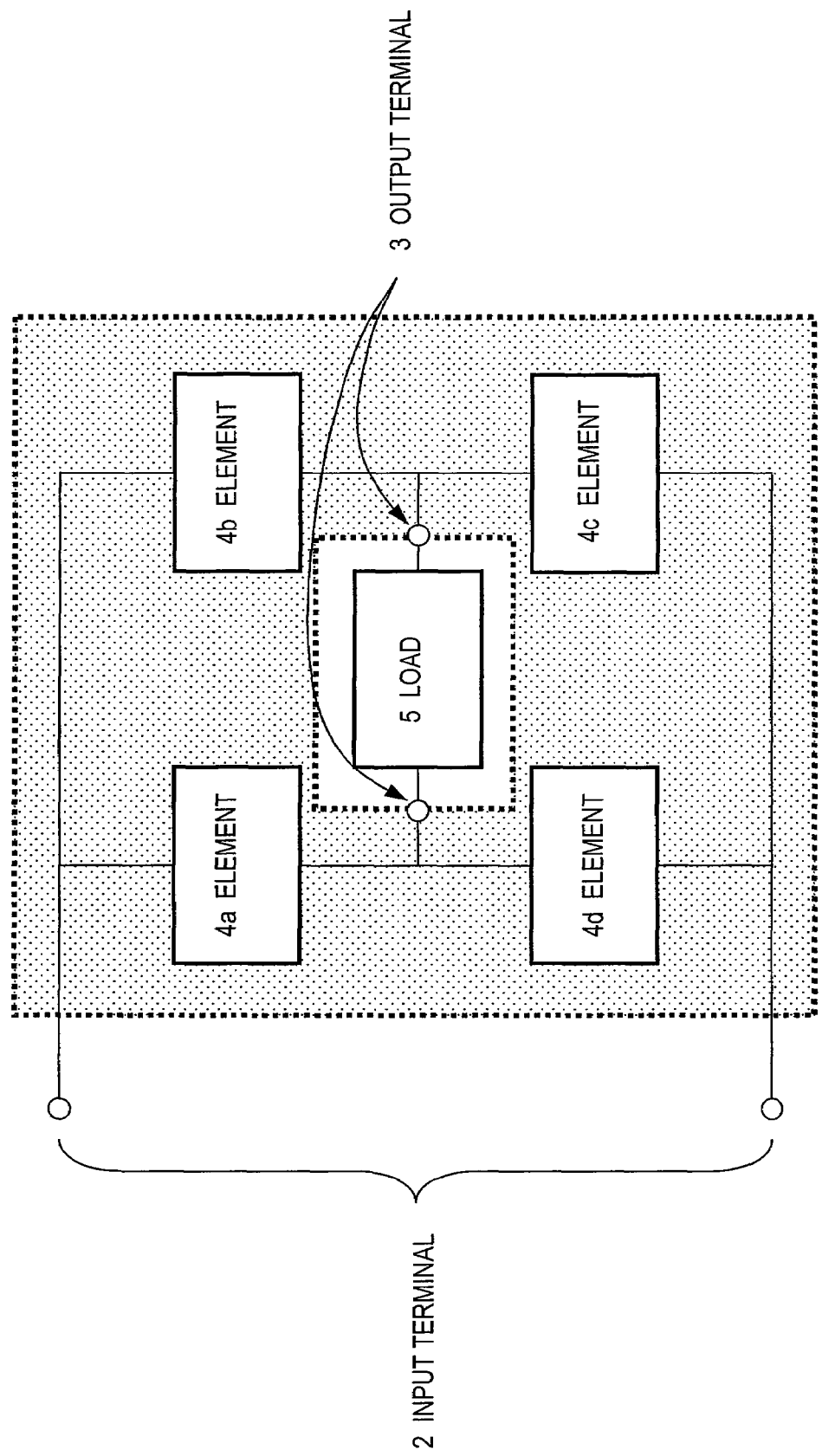
FIG. 1 is a circuit block diagram illustrating a circuit configuration for a dual-frequency matching circuit as a first preferred embodiment of the present invention.

FIG. 1 is a circuit block diagram illustrating a circuit configuration for a dual-frequency matching circuit as a preferred embodiment of the present invention. As shown in FIG. 1, the dual-frequency matching circuit 1 of this preferred embodiment includes input terminals 2 consisting of first and second input terminals 2a and 2b and output terminals 3 consisting of first and second output terminals 3a and 3b. An RF circuit (not shown) is connected to the input terminals 2, while a load 5 is connected to the output terminals 3.

The dual-frequency matching circuit 1 of this preferred embodiment includes four elements 4a, 4b, 4c and 4d, which are lumped constant elements and each of which is either an inductor or a capacitor. The types of these elements 4a, 4b, 4c and 4d, which should be either inductors or capacitors, and the specific values of their respective element constants are determined unequivocally by the impedance value of the load 5 that has been defined in advance on the two frequency bands, where matching should be achieved, and by the impedance value of the RF circuit connected to the input terminals 2. As for specifically how to determine them, it will be described in detail later.

The connection structure of the input terminals 2, the elements 4a, 4b, 4c and 4d and the load 5 is similar to that of a so-called "seven-segment display", which is often used to display numerals on a calculator or a digital watch. More specifically, suppose in the three horizontally running segments of the seven-segment display, the top and bottom segments are associated with the input terminals 2 and the load 5 is allocated to the other horizontally running segment. Then, the remaining four vertical segments are associated with the elements 4a, 4b, 4c and 4d.

In this case, the dual-frequency matching circuit 1 of the present invention has a geometrically symmetric circuit configuration. That is why even if the elements 4a, 4b, 4c and 4d are rearranged in any of the following manners, the rearranged circuit will exhibit quite the same characteristic as the original one. A first one of those rearrangements is to exchange the positions of the elements 4a and 4b and the positions of the elements 4d and 4c with each other at the same time. This first rearrangement is equivalent to moving the input terminals 2 that are located on the left-hand side of the dual-frequency matching circuit 1 of the present invention to the right-hand side as shown in FIG. 1. A second one of those rearrangements is to exchange the positions of the elements 4a and 4d and the positions of the elements 4b and 4c with each other at the same time. This second rearrangement is equivalent to changing the connections of the two output terminals of an external circuit (not shown in FIG. 1). For example, if the output terminals of the external circuit not shown in FIG. 1 form an unbalanced wire circuit, the rearrangement means changing the terminals to be connected to the ground plane of the output terminal of the external circuit not shown in FIG. 1 between the upper and lower ones of the input terminals 2 shown in FIG. 1. It can also be confirmed by Equations (2) of the design process to be described later that the first and second rearrangements produce an electrically equivalent circuit. That is why even though there may be a number of circuit configurations available for the dual-frequency matching circuit 1 of the present invention according to the design process to be described later, the circuit configurations to be correlated with each other in the first and second rearrangements are not independent of each other but may be combined into a single circuit configuration.

Next, it will be described specifically how to determine the element constant values of the elements 4a, 4b, 4c and 4d. Since each of these elements 4a, 4b, 4c and 4d is either an inductor or a capacitor, the impedance of each element is a pure imaginary number. Thus, in the following description, the impedances of the respective elements are supposed to have the signs shown in FIG. 2.

Figure 2:
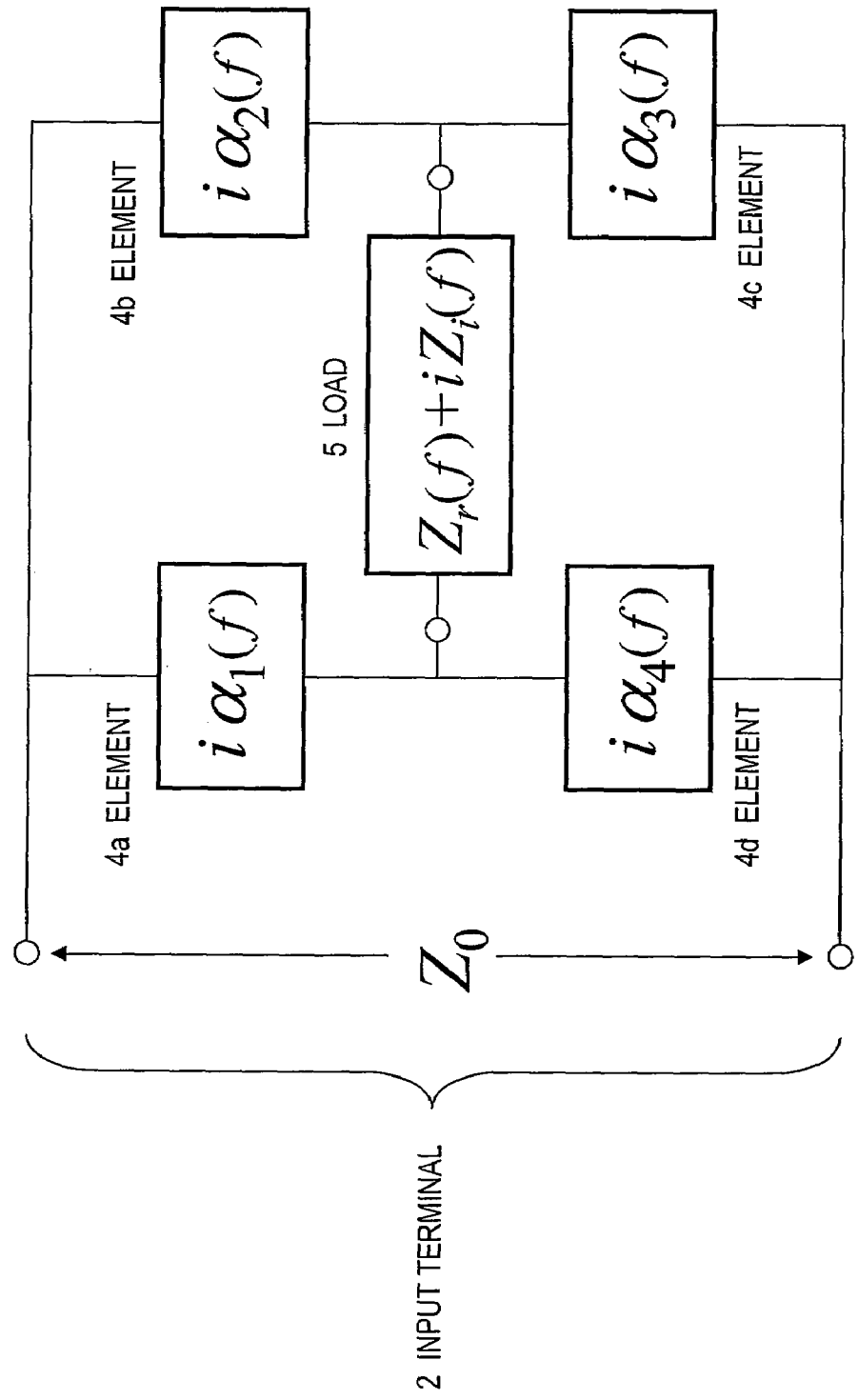
FIG. 2 shows sign and other notations to illustrate how to determine element constants in the dual-frequency matching circuit of the first preferred embodiment of the present invention.

FIG. 2 shows sign and other notations to illustrate how to determine element constants in the dual-frequency matching circuit of this preferred embodiment of the present invention. In FIG. 2, the small letter "i" represents an imaginary unit.

That is to say, $i=(-1)^{\wedge}(\frac{1}{2})$. The impedance value Z0 of the RF circuit connected to the input terminals 2 is a real number value and is usually 50 Ω. On the other hand, the impedance of the load 5 is normally a complex quantity, which has frequency dependency and the real part Zr(f) and the imaginary part Zi(f) (where f denotes the frequency) of which are represented by two real number quantities.

As described above, the impedance of each element is represented by a real number quantity αj(f) (where j=1, 2, 3 or 4). Also, depending on whether each element is an inductor or a capacitor, αj(f) (where j=1, 2, 3 or 4) is defined by the following Equation (1):

$$\alpha_j(f) = \begin{cases} -\dfrac{1}{(2\pi f)C_j} & \text{(capacitor)} \\ (2\pi f)L_j & \text{(inductor)} \end{cases}, (j = 1, 2, 3, 4)$$

In Equation (1), Lj and Cj are element constants (i.e., the inductance and capacitance, respectively) of the $j^{th}$ element. At this point in time, those specific values have not been determined yet and are still unknown numbers. That is why the specific Lj and Cj values are obtained by solving the following four simultaneous equations (which will be collectively referred to herein as Equations (2)) at the two frequencies f1 and f2 at which the impedance matching should be achieved.

$$A(f_k) - Z_0 C(f_k) = 0 \qquad (2)$$
$$B(f_k) - Z_0 D(f_k) = 0, (k = 1, 2)$$

$$\begin{cases} A(f) = Z_r(f)\{\alpha_2(f) + \alpha_3(f)\}\{\alpha_1(f) + \alpha_4(f)\} \\ B(f) = Z_i(f)\{\alpha_2(f) + \alpha_3(f)\}\{\alpha_1(f) + \alpha_4(f)\} + \\ \quad [\{\alpha_2(f) + \alpha_3(f)\}\alpha_1(f) + \alpha_4(f) + \\ \quad \alpha_2(f)\alpha_3(f)\{\alpha_1(f) + \alpha_4(f)\}] \\ C(f) = Z_i(f)\{\alpha_1(f) + \alpha_2(f) + \alpha_3(f) + \alpha_4(f)\} + \\ \quad \{\alpha_1(f) + \alpha_2(f)\}\{\alpha_3(f) + \alpha_4(f)\} \\ D(f) = -Z_r(f)\{\alpha_1(f) + \alpha_2(f) + \alpha_3(f) + \alpha_4(f)\} \end{cases}$$

Equations (2) may be solved in the following manner. First, each of the elements 4a, 4b, 4c and 4d is provisionally supposed to be a capacitor or an inductor. Then, αj(f) (where j=1, 2, 3 or 4) becomes a function relative to the frequency f, including four undetermined element constants (Lj or Cj), according to Equation (1). Then, the impedance Zr(f) and Zi(f) of the load 5 and the impedance value Z0 of the RF circuit connected to the input terminals 2, of which the frequency characteristics are already known, and αj(f) (where j=1, 2, 3 or 4), of which the specific function form has been determined by Equation (1), are substituted into the right sides of the third through sixth ones (as counted from the top) of Equations (2), thereby constituting A(f), B(f), C(f) and D(f). Then, A(f), B(f), C(f) and D(f), of which the specific function forms relative to the frequency f are now known, are substituted into the two-condition equation on the first and second rows of Equations (2) and two desired frequencies fk (where k=1 and 2) are given, thereby obtaining four mutually independent equations with respect to the four undetermined element constants (Lj or Cj). Then, those four equations are solved simultaneously to derive the four undetermined element constants. It should be noted that since the number of undetermined constants agrees with that of independent equations, Equations (2) always have solutions. However, the element constants must be positive real numbers. That is why only if positive real numbers are obtained as solutions Lj or Cj, the dual-frequency matching circuit of this preferred embodiment can be actually implemented as the circuit shown in FIG. 2.

Sixteen (2^4=16) different combinations of capacitors and inductors can be allocated to the elements 4a, 4b, 4c and 4d. That is why by solving Equations (2) just as described above for each and every one of those sixteen combinations, all possible circuit configurations that could be implemented as real circuits can be extracted. After that, it is necessary to perform the processing step of selecting an independent circuit properly by combining together, into a single circuit, a number of mutually correlated circuit configurations to be obtained by first and second rearrangements due to the geometric symmetry of the circuits. And if one of those possible independent circuit configurations that satisfies most perfectly the requirements imposed on the antenna as needed is selected according to the situation, the design process of the dual-frequency matching circuit of this preferred embodiment is completed.

Examples of those requirements to be imposed as needed include whether the bandwidth that would achieve good matching is sufficiently broad or not, whether the dual-frequency matching circuit is made up of elements with small element constants or not (i.e., whether or not there is any inductor with a large element constant), and whether or not the matching property is affected easily by a variation in the impedance of the antenna. If the dual-frequency matching circuit of the present invention is designed as a matching circuit for an antenna in a mobile terminal as described above, the last requirement is particularly important.

According to such a configuration, a dual-frequency matching circuit is made up of four lumped elements, each of which is either a capacitor or an inductor, thereby reducing the minimum required number of elements to four. And as those elements are coupled together with a circuit configuration other than a ladder circuit consisting of resonant circuits, a dual-frequency matching circuit, which would cause little loss and would operate with good stability without having its impedance matching easily affected by a variation in the impedance of the load 5, can be provided.

In the preferred embodiment described above, each of the elements 4a, 4b, 4c and 4d is supposed to be either a single inductor or a single capacitor. However, if any of those elements is implemented as an inductor, the inductor could be replaced with two or more inductors that are connected in series together as shown in FIG. 3A, which is a circuit diagram illustrating how to expand an inductor (that is a single constituent element of the dual-frequency matching circuit of this preferred embodiment) into a circuit consisting of multiple inductors. Likewise, if any of those elements is implemented as a capacitor, the capacitor could be replaced with two or more capacitors that are connected in parallel with each other as shown in FIG. 3B, which is a circuit diagram illustrating how to expand a capacitor (that is a single constituent element of the dual-frequency matching circuit of the first preferred embodiment of the present invention) into a circuit consisting of multiple capacitors. In both of these two cases, however, the overall inductance of the entire circuit or the overall capacitance of the entire circuit needs to agree with the element constant that has been obtained for a single element by the design process described above.

Specific Example 1

Hereinafter, a specific example of a dual-frequency matching circuit according to the present invention will be described. The basic configuration of this specific example is the same as the configuration of the preferred embodiment shown in FIG. 1.

Figure 4A:
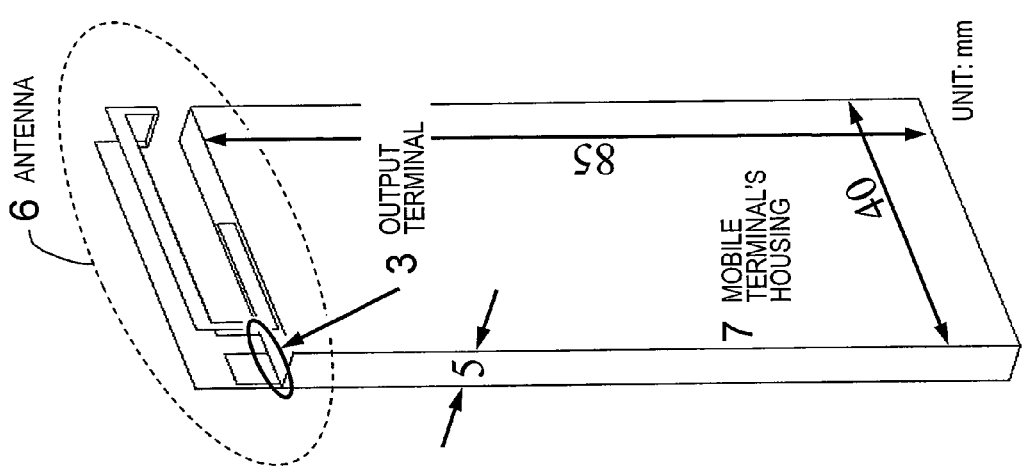
FIG. 4A is a perspective view showing the overall dimensions of the analytical model.
Figure 4B:
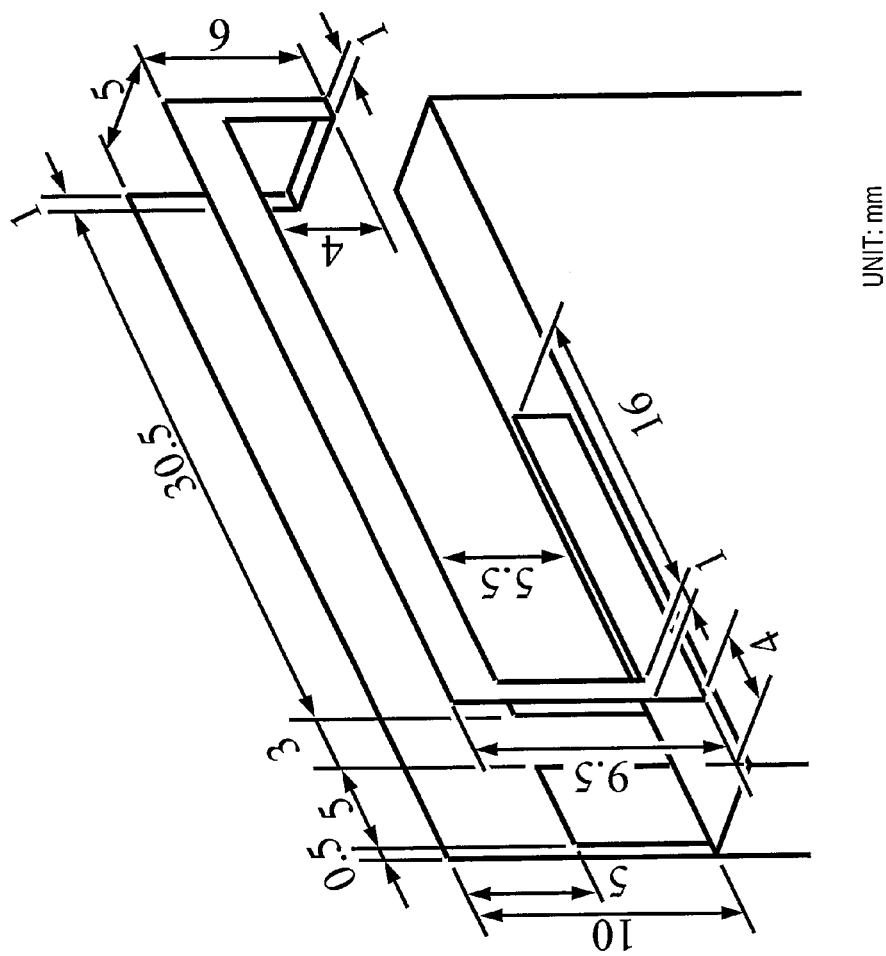
FIG. 4B is a perspective view showing the detailed dimensions of the antenna portion thereof.

FIG. 4 is a perspective view showing the dimensions of an analytical model for a mobile terminal with an antenna as a specific example of the present invention. Specifically, FIG. 4A is a perspective view showing the overall dimensions of the analytical model and FIG. 4B is a perspective view showing the detailed dimensions of the antenna portion thereof. In FIG. 4, the entire analytical model is made of a metallic plate with a thickness of 100 μm and a conductivity of $4.9 \times 10^7$ Sie/m.

As shown in FIG. 4A, the antenna 6 is an inverted F antenna formed by folding the metallic plate and is connected to the top end of a metallic box with dimensions of 40 mm×85 mm×5 mm, which represents a model of the housing 7 of a mobile terminal. The output terminal 3 for inputting an RF signal to the antenna 6 (more specifically, the first output terminal 3a connected to the elements 4b and 4c shown in FIG. 1) is located at the encircled position in FIG. 4A. On the other hand, the second output terminal 3b that is short-circuited with the second input terminal 2b in FIG. 1 corresponds to the grounded housing shown in FIG. 4A.

Also, supposing this analytical model was put in a free space (i.e., an infinite vacuum), the model was subjected to a radio frequency analysis using an electromagnetic field simulator IE3D version 11.23, thereby extracting the frequency behaviors of the impedance of the antenna 6, including the influence of the mobile terminal's housing 7 at the output terminals 3. In this specific example, the antenna had an impedance of $103.5-90.1i\ \Omega$ (where i is an imaginary unit) at a frequency of 0.85 GHz and an impedance of $44.9-15.9i\ \Omega$ (where i is an imaginary unit) at a frequency of 1.86 GHz, respectively.

Hereinafter, it will be described how to design the dual-frequency matching circuit of this specific example, which will be connected to the output terminals 3 of the mobile terminal shown in FIG. 4, by the design process of the preferred embodiment described above. As a comparative example, it will also be described how to design a dual-frequency matching circuit with the conventional configuration described above. And their degrees of stability with respect to the variation in the impedance of the antenna 6, including the influence of the mobile terminal's housing 7, will be compared to each other, thereby confirming the superiority of the dual-frequency matching circuit of the present invention over the conventional one.

Figure 5B:
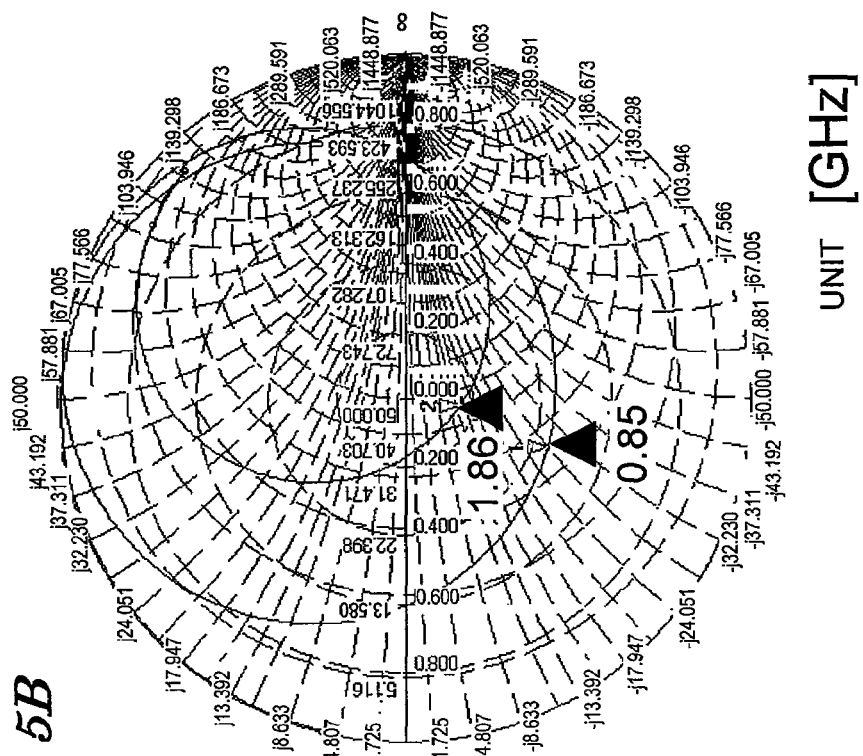
FIG. 5A shows the frequency dependency of a voltage standing wave ratio and FIG. 5B is a Smith chart of the single-terminal S parameters.
Figure 5A:
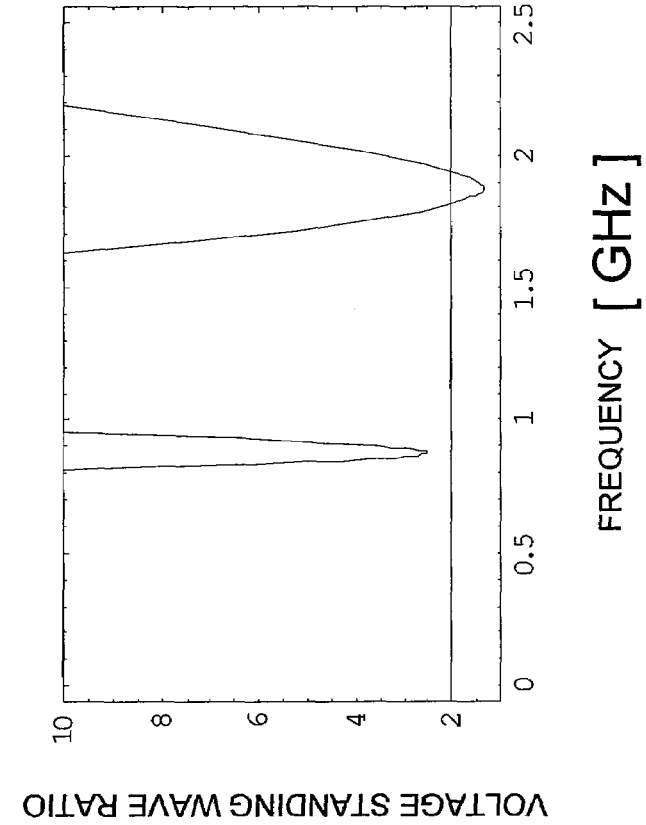

First, the single-terminal S parameters, which were calculated at the output terminals 3 of the mobile terminal shown in FIG. 4 by performing electromagnetic field simulations, are shown in FIG. 5. Specifically, FIG. 5 shows the frequency dependency of the radio frequency properties of the analytical model shown in FIG. 4 at the output terminals 3 with an impedance of 50 Ω in this specific example. More specifically, FIG. 5A shows the frequency dependency of a voltage standing wave ratio and FIG. 5B is a Smith chart of the single-terminal S parameters.

In this specific example, the two frequencies f1 and f2, at which the impedance matching should be achieved, are supposed to be 0.85 GHz and 1.86 GHz, respectively, and the impedance value of the RF circuit to be matched is supposed to be 50 Ω (i.e., Z0=50). As can be seen from FIG. 5A, the antenna produces resonances in the vicinity of those frequencies f1 and f2. However, at the frequency f1, in particular, a sufficient degree of matching (i.e., voltage standing wave ratio≦2) is not achieved. Such a result is also observed in FIG. 5B. Specifically, as indicated by the solid triangles ▲ in FIG. 5B, at the frequency f1, matching with 50 Ω is not realized. That is why the dual-frequency matching circuit of the present invention is designed and connected to the output terminals 3, thereby achieving complete matching (corresponding to a voltage standing wave ratio of one) at both of those two frequencies.

The element constants that were calculated by the design process described above are shown in FIG. 6, which is a table of element constants in the dual-frequency matching circuit of the present invention that was designed for the analytical model of this specific example shown in FIG. 4. In FIG. 6, the letters C and L in the Element Configuration portion of the table denote a capacitor and an inductor, respectively. Also, in FIG. 6, specific element constant values of the elements, which were calculated for the results of electromagnetic field simulations shown in FIG. 5, are shown in the Element Constant portion of the table.

Thus, the dual-frequency matching circuit of this specific example includes: first and second input terminals 2a, 2b that receive a first RF signal with a frequency of 0.85 GHz and a second RF signal with a frequency of 1.86 GHz, respectively, from an RF circuit with an impedance of 50 Ω; first and second output terminals 3a, 3b that are connected to an antenna (load 5); and a group of circuit elements that are connected between the input terminals 2 and the output terminals 3.

The group of circuit elements includes first, second, third and fourth elements 4a, 4b, 4c and 4d. The first and fourth elements 4a and 4d are connected in series between the first and second input terminals 2a and 2b and the second and third elements 4b and 4c are connected in series between the first and second input terminals 2a and 2b. The first output terminal 3a is connected to a connection node between the first and fourth elements 4a and 4d, and the second output terminal 3b is connected to a connection node between the second and third elements 4b and 4c.

The group of circuit elements is one of the following two sets:

The first set includes an inductor with an inductance of 12.084 nH, an inductor with an inductance of 5.452 nH, an inductor with an inductance of 14.508 nH, and a capacitor with a capacitance of 1.934 pF as the first, second, third and fourth elements, respectively.

And the second set includes a capacitor with a capacitance of 1.023 pF, an inductor with an inductance of 5.772 nH, a capacitor with a capacitance of 0.904 pF, and an inductor with an inductance of 14.927 nH as the first, second, third and fourth elements, respectively.

When used, every mobile terminal always comes close to the user's hand or head. And the degrees of the closeness change according to how he or she uses it or who uses it. That is why to provide good telecommunication quality, it is important to stabilize the matching property with respect to a variation in the impedance of the antenna that will be caused when the user's hand or head comes close to the terminal. Thus the present inventors calculated how much the characteristic of the analytical model shown in FIG. 4 deteriorated when a modeled hand 8 came close to that model.

Figure 7:
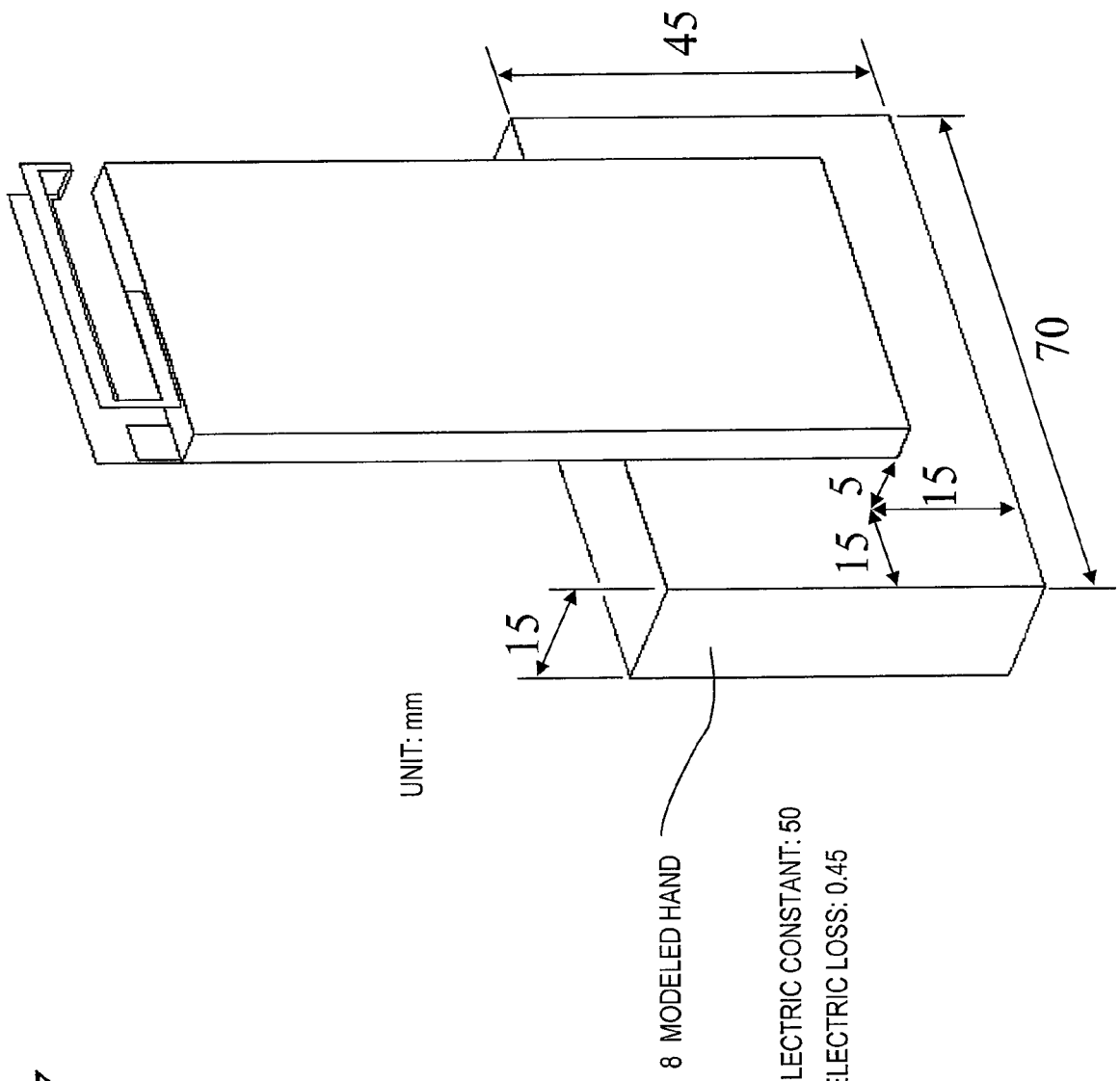
FIG. 7 is a perspective view showing the dimensions and position of a modeled hand that was added to the analytical model shown in FIG. 4 in a specific example of the first preferred embodiment of the present invention.

FIG. 7 is a perspective view showing the dimensions and position of a modeled hand that was added to the analytical model shown in FIG. 4 in a specific example of the first preferred embodiment of the present invention. In FIG. 7, the modeled hand 8 was supposed to be a dielectric block with a uniform dielectric constant of 50 and a uniform dielectric loss of 0.45. The present inventors carried out similar electromagnetic field simulations under these circumstances. The degrees of decline of the relative bands that were calculated by those simulations are shown in FIG. 8.

FIG. 8 is a table showing the change ratios of the impedance matching bandwidth of the dual-frequency matching circuits of the present invention, which were designed as shown in FIG. 6, in this specific example of the first preferred embodiment of the present invention, when a hand came close to the mobile terminal as shown in FIG. 7. In FIG. 8, the "bandwidth change ratio" was calculated by {(bandwidth with hand)−(bandwidth without hand)}/(bandwidth without hand)×100.

As used herein, the "band" is defined to be a frequency band with a voltage standing wave ratio of 2 or less. It can be seen from FIG. 8 that the circuit configuration that resulted in the smallest variation even when a hand came close to the circuit was Case 2.

Figure 12A:
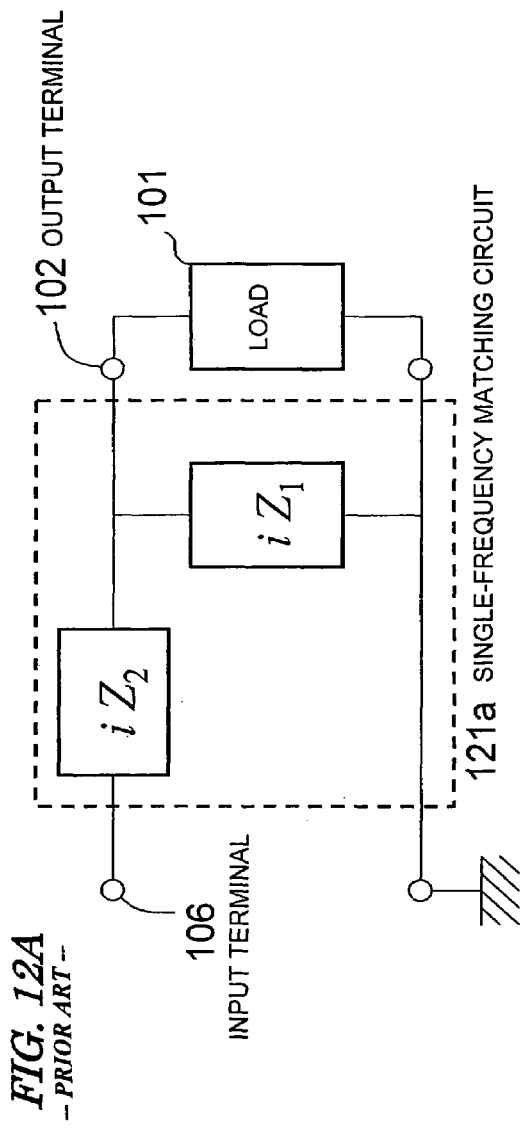
FIGS. 12A and 12B illustrate circuit block diagrams showing the circuit configurations of the two fundamental types of single-frequency matching circuits disclosed in Non-Patent Document No. 1.
Figure 12B:
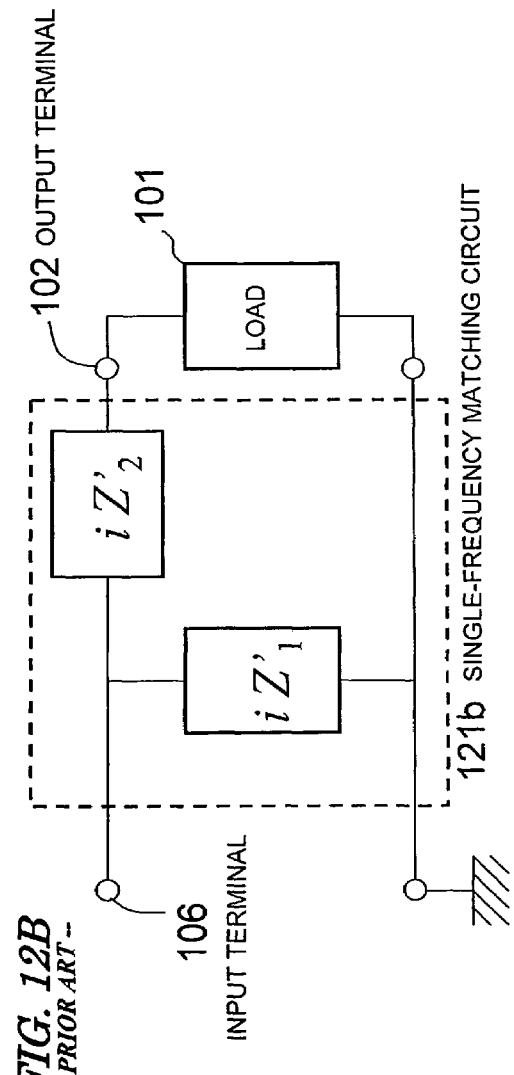

Even within the scope of the conventional technology described above, a dual-frequency matching circuit can also be made up of the same number of elements (i.e., four elements) as the dual-frequency matching circuit of the present invention. Such a circuit has a circuit configuration in which the single-frequency matching circuits with the configuration shown in FIG. 12 are connected together to form a ladder circuit as shown in FIG. 13. And the circuit can be implemented as one of the two independent circuits shown in FIG. 9.

FIG. 9 shows block diagrams of conventional dual-frequency matching circuits. Specifically, FIG. 9A is a block diagram of a dual-frequency matching circuit based on the single-frequency matching circuit disclosed in Non-Patent Document No. 1 shown in FIG. 12A. On the other hand, FIG. 9B shows a dual-frequency matching circuit based on the single-frequency matching circuit disclosed in Non-Patent Document No. 1 shown in FIG. 12B. As for these conventional dual-frequency matching circuits, the bandwidth change ratios of the matching bands when a hand comes close to the circuits can also be calculated by the same procedure as the one for obtaining the results shown in FIG. 8. The results are shown in FIGS. 10A and 10B.

FIG. 10 shows a table showing the element configurations, element constants of the conventional dual-frequency matching circuits and bandwidth change ratios of the matching bands when a hand comes close to them. Specifically, FIG. 10A shows the results (no solutions) obtained for the dual-frequency matching circuit shown in FIG. 9A. FIG. 10B shows a table that was calculated for the dual-frequency matching circuit shown in FIG. 9B. As shown in FIG. 10A, in this specific example, no matching can be achieved by the dual-frequency matching circuit shown in FIG. 9A. That is why the only circuit configuration available for the conventional dual-frequency matching circuit is the one shown in FIG. 9B.

Comparing FIGS. 8 and 10 to each other, it can be seen that the element configuration in Case 2 of the dual-frequency matching circuit of the present invention exhibited the highest degree of stability at both of the two frequencies (and particularly at the frequency f1). That is to say, it can be seen that the present invention is superior to the prior art in terms of the ability to ensure stabilized matching property, which is one of the most important requirements for a mobile terminal.

Specific Example 2

Hereinafter, another specific example of a dual-frequency matching circuit according to the present invention will be described.

The frequency bands that are already utilized currently and the ones that will be exploited in the near future can be roughly classified into the three frequency bands, namely, a low frequency band in a 0.45 GHz range, an intermediate frequency band in 0.8 GHz, 0.85 GHz and 0.9 GHz ranges, and a radio frequency band in 1.5 GHz, 1.7 GHz, 1.8 GHz, 1.9 GHz and 2.0 GHz ranges. Among other things, the intermediate and radio frequency bands are in particularly high demand for common use. For that reason, in this specific example, a representative frequency of 0.85 GHz is selected from the intermediate frequency band and three representative frequencies of 1.55 GHz, 1.7 GHz and 2.05 GHz are selected from the radio frequency band to design an antenna first.

These frequencies are selected because all the other frequency bands are asymptotic to one of the four selectable frequencies including 1.86 GHz and because as far as the frequency dependency of the antenna's impedance is concerned, there should be no significant deviation from the designed value at the selected frequency.

In this specific example, the impedance of the antenna is 54.4−8.3i Ω at a frequency of 0.85 GHz, 0.48+46.3i Ω at a frequency of 1.55 GHz, 1.80+57.7i Ω at a frequency of 1.7 GHz, and 50.4+8.15i Ω at a frequency of 2.05 GHz, respectively.

The configuration of this specific example is basically the same as, but is slightly different from, that of the preferred embodiment shown in FIG. 1. One of the differences between the two lies in that the structure and dimensions of the antenna may change in this specific example according to the selected frequency in the radio frequency band. In addition, as will be described later, the impedances of the first, second, third and fourth elements that form the dual-frequency matching circuit are also different.

Figure 14:
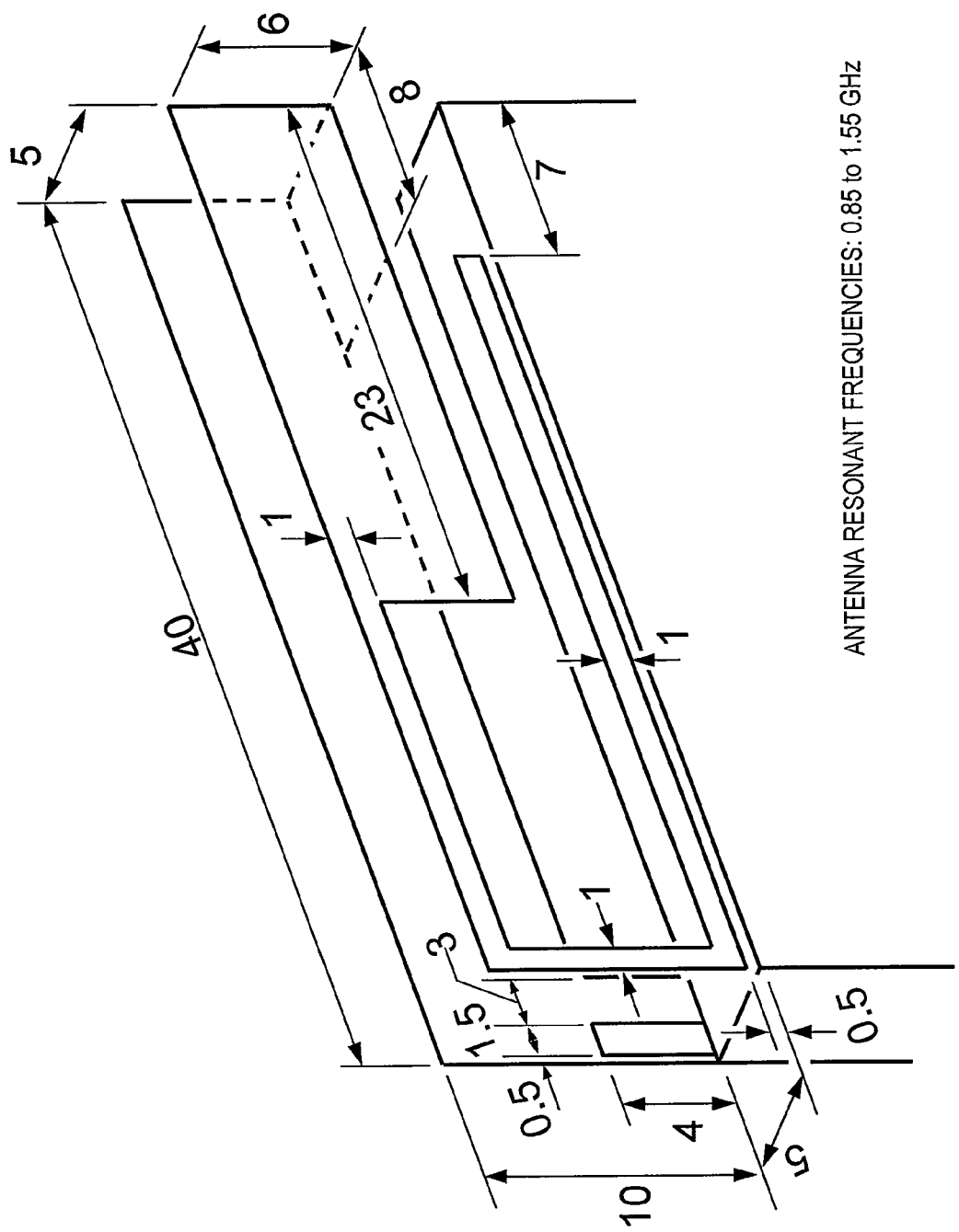
FIG. 14 is a perspective view showing the detailed dimensions of an antenna portion according to a second specific example of the first preferred embodiment of the present invention (with antenna resonant frequencies of 0.85 GHz and 1.55 GHz).
Figure 15:
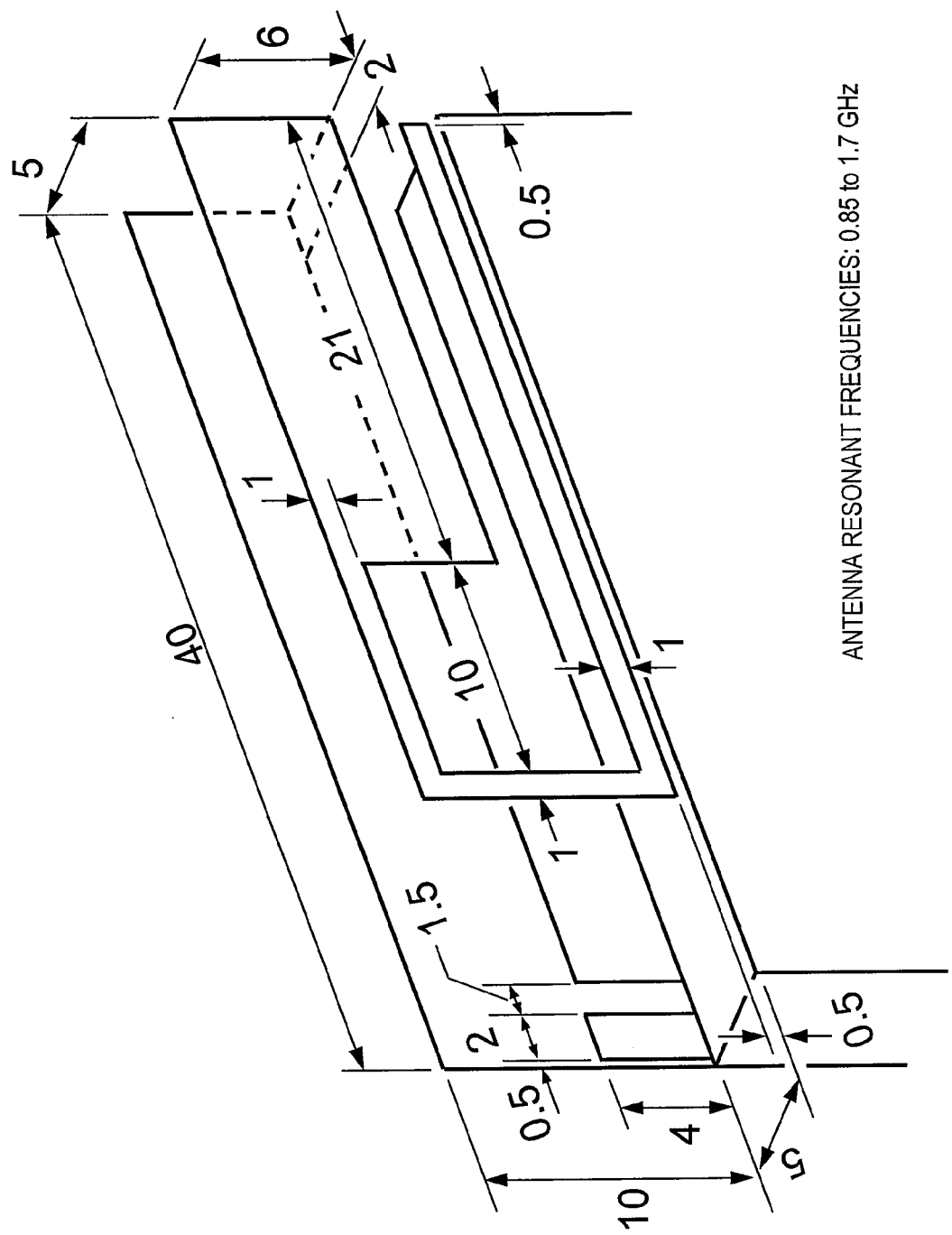
FIG. 15 is a perspective view showing the detailed dimensions of an antenna portion according to the second specific example of the first preferred embodiment of the present invention (with antenna resonant frequencies of 0.85 GHz and 1.7 GHz).
Figure 16:
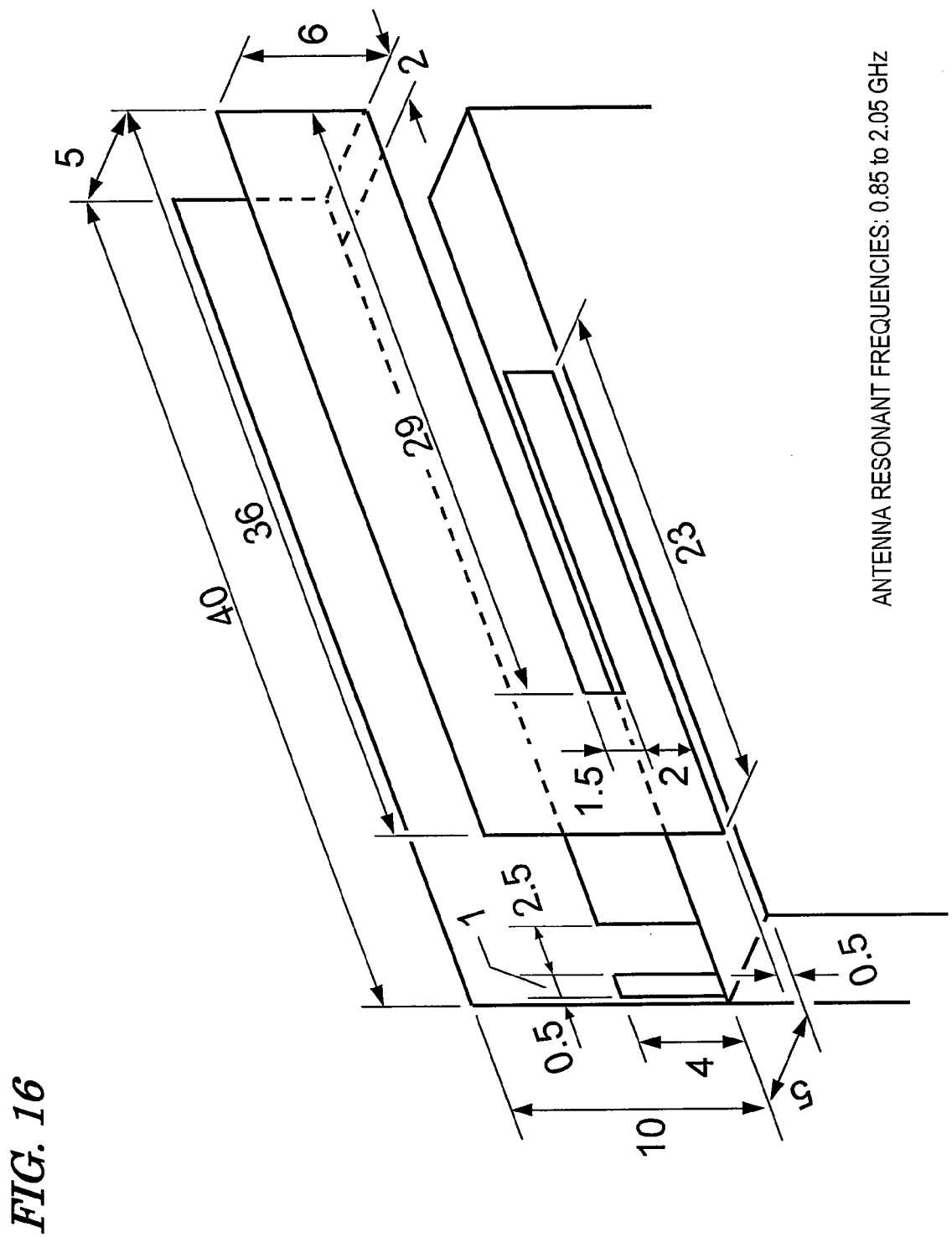
FIG. 16 is a perspective view showing the detailed dimensions of an antenna portion according to the second specific example of the first preferred embodiment of the present invention (with antenna resonant frequencies of 0.85 GHz and 2.05 GHz).

The antennas that can be connected to the dual-frequency matching circuit of this specific example are shown in FIGS. 14, 15 and 16, which are perspective views illustrating the detailed dimensions of the antennas of this specific example. The antenna shown in FIG. 14 is designed so as to produce resonances at frequencies of 0.85 GHz and 1.55 GHz. The antenna shown in FIG. 15 is designed so as to produce resonances at frequencies of 0.85 GHz and 1.7 GHz. And the antenna shown in FIG. 16 is designed so as to produce resonances at frequencies of 0.85 GHz and 2.05 GHz. It should be noted that the housing to be loaded with the antenna shown in FIG. 14, 15 or 16 is supposed to have the same configuration and dimensions as the ones shown in FIG. 4A. Also, in this specific example, the antenna and the housing are all made of a metallic plate with a thickness of 100 μm and a conductivity of 4.9×10^7 Sie/m as in the first specific example described above. The antenna was also designed using an electromagnetic field simulator IE3D version 11.23 as in the specific example described above.

Figure 17B:
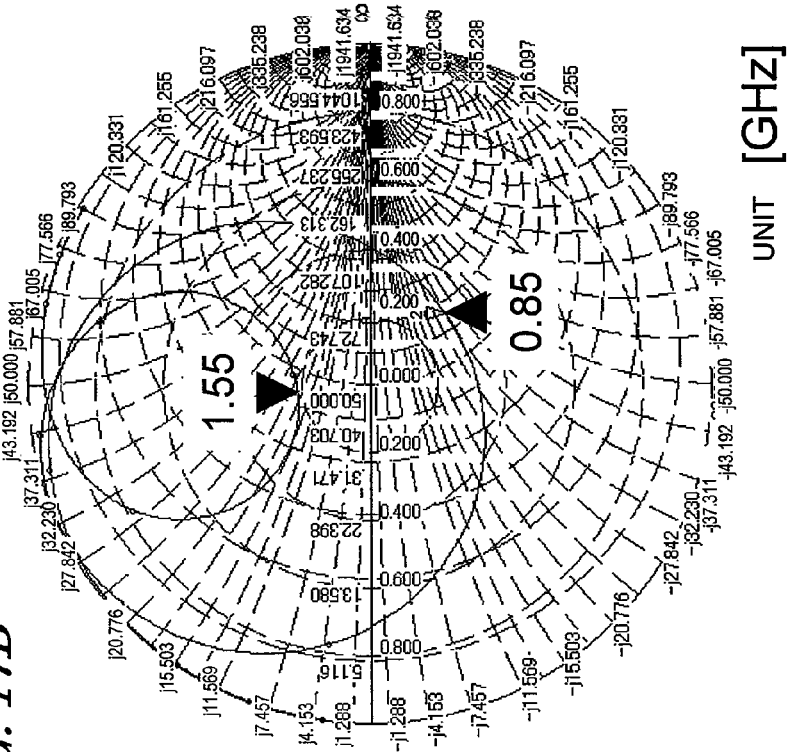
Figure 17A:
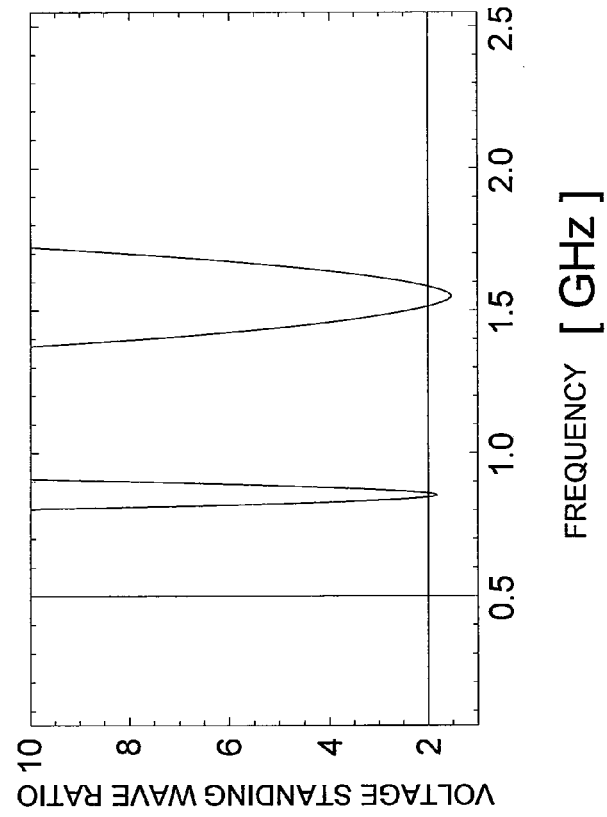
FIG. 17A shows the frequency dependency of the radio frequency properties of the analytical model shown in FIG. 14 at the output terminals 3 with an impedance of 50 Ω in the second specific example of the first preferred embodiment of the present invention. Specifically.
Figure 18A:
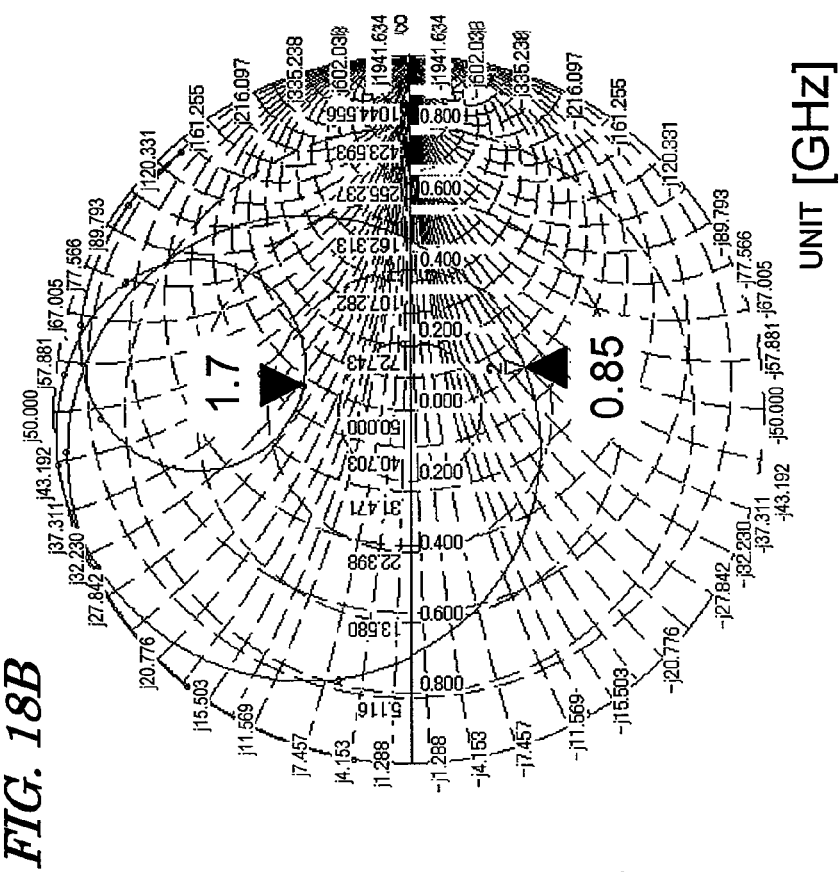
FIG. 18A shows the frequency dependency of the radio frequency properties of the analytical model shown in FIG. 15 at the output terminals 3 with an impedance of 50 Ω in the second specific example of the first preferred embodiment of the present invention. Specifically.
Figure 18B:
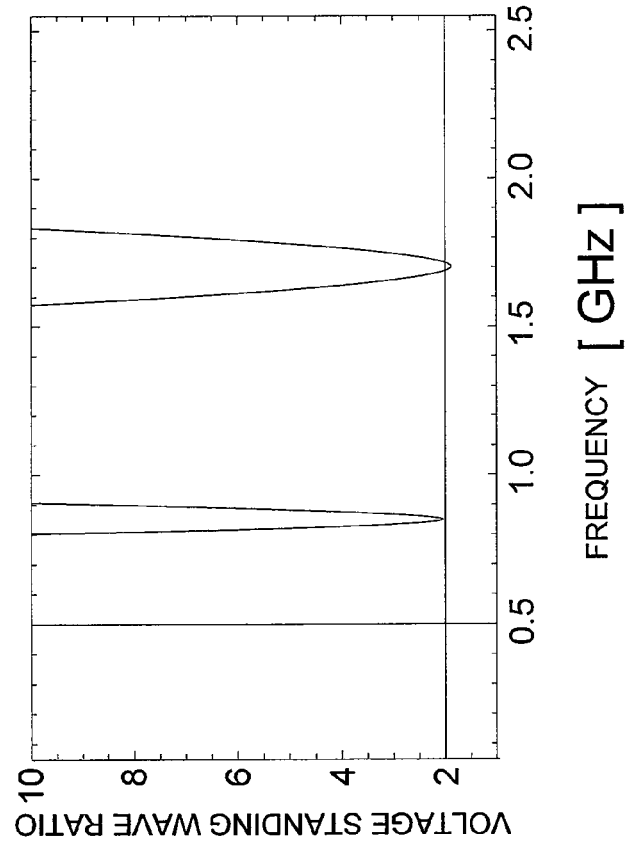
Figure 19B:
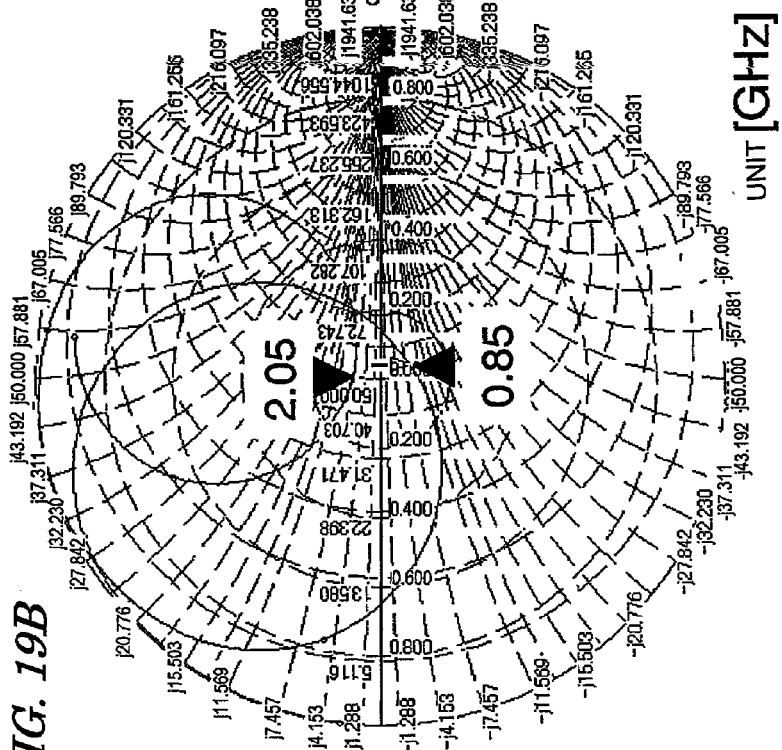
Figure 19A:
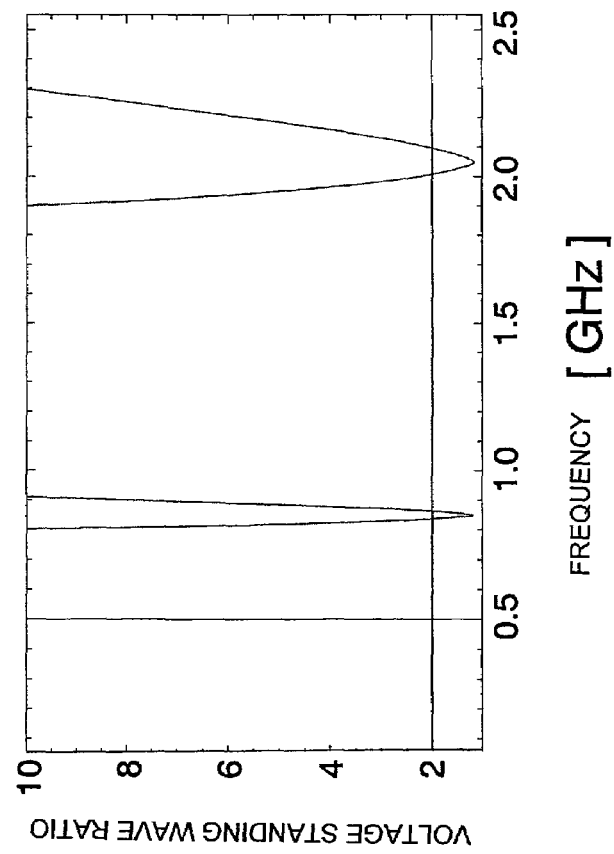
FIG. 19A shows the frequency dependency of the radio frequency properties of the analytical model shown in FIG. 16 at the output terminals 3 with an impedance of 50 Ω in the second specific example of the first preferred embodiment of the present invention. Specifically.

The frequency dependencies of the radio frequency properties at the output terminal 3 that is connected to the antenna shown in FIG. 14, 15 or 16 in this specific example are shown in FIGS. 17, 18 and 19, respectively. FIGS. 17A, 18A and 19A are graphs each showing the frequency dependency of a voltage standing wave ratio and FIGS. 17B, 18B and 19B are Smith charts of the single-terminal S parameters.

As can be seen easily from FIGS. 17, 18 and 19, to realize good impedance matching between the antenna and the circuit at the two selected frequencies (i.e., designed frequencies), the dual-frequency matching circuit needs to be inserted into any of these antennas.

The element configurations and element constants of the dual-frequency matching circuits of this specific example to be connected to the antennas shown in FIGS. 14, 15 and 16, respectively, are shown in FIGS. 20, 21 and 22, which are tables of element constants in the dual-frequency matching circuits that were designed for the analytical models shown in FIGS. 14, 15 and 16, respectively. The specific element constants shown in FIGS. 20, 21 and 22 were calculated for the results of the electromagnetic field simulations shown in FIGS. 14, 15 and 16. In FIGS. 20, 21 and 22, the letters C and L in the Element Configuration portion of the tables denote a capacitor and an inductor, respectively. Also, in FIGS. 20, 21 and 22, specific element constant values of the elements, which were calculated for the results of electromagnetic field simulations shown in FIG. 5, are shown in the Element Constant portion of the tables.

The dual-frequency matching circuits defined by FIGS. 20, 21 and 22 have the following configurations:

Configuration Shown in FIG. 20

This dual-frequency matching circuit includes: first and second input terminals 2a, 2b that receive a first RF signal with a frequency of 0.85 GHz and a second RF signal with a frequency of 1.55 GHz, respectively, from an RF circuit with an impedance of 50 Ω; first and second output terminals 3a, 3b that are connected to an antenna (load 5); and a group of circuit elements that are connected between the input terminals 2 and the output terminals 3.

The group of circuit elements includes first, second, third and fourth elements 4a, 4b, 4c and 4d. The first and fourth elements 4a and 4d are connected in series between the first and second input terminals 2a and 2b and the second and third elements 4b and 4c are connected in series between the first and second input terminals 2a and 2b. The first output terminal 3a is connected to a connection node between the first and fourth elements 4a and 4d, and the second output terminal 3b is connected to a connection node between the second and third elements 4b and 4c.

The first element 4a is an inductor with an inductance of 4.030 nH. The second element 4b is an inductor with an inductance of 11.208 nH. The third element 4c is an inductor with an inductance of 2.497 nH. And the fourth element 4d is a capacitor with a capacitance of 2.233 pF.

Configuration Shown in FIG. 21

This dual-frequency matching circuit includes: first and second input terminals 2a, 2b that receive a first RF signal with a frequency of 0.85 GHz and a second RF signal with a frequency of 1.7 GHz, respectively, from an RF circuit with an impedance of 50 Ω; first and second output terminals 3a, 3b that are connected to an antenna (load 5); and a group of circuit elements that are connected between the input terminals 2 and the output terminals 3.

The group of circuit elements includes first, second, third and fourth elements 4a, 4b, 4c and 4d. The first and fourth elements 4a and 4d are connected in series between the first and second input terminals 2a and 2b and the second and third elements 4b and 4c are connected in series between the first and second input terminals 2a and 2b. The first output terminal 3a is connected to a connection node between the first and fourth elements 4a and 4d, and the second output terminal 3b is connected to a connection node between the second and third elements 4b and 4c.

The first element 4a is an inductor with an inductance of 2.132 nH. The second element 4b is an inductor with an inductance of 8.266 nH. The third element 4c is an inductor with an inductance of 0.596 nH. And the fourth element 4d is a capacitor with a capacitance of 2.097 pF.

Configuration Shown in FIG. 22

This dual-frequency matching circuit includes: first and second input terminals 2a, 2b that receive a first RF signal with a frequency of 0.85 GHz and a second RF signal with a frequency of 2.05 GHz, respectively, from an RF circuit with an impedance of 50 Ω; first and second output terminals 3a, 3b that are connected to an antenna (load 5); and a group of circuit elements that are connected between the input terminals 2 and the output terminals 3.

The group of circuit elements includes first, second, third and fourth elements 4a, 4b, 4c and 4d. The first and fourth elements 4a and 4d are connected in series between the first and second input terminals 2a and 2b and the second and third elements 4b and 4c are connected in series between the first and second input terminals 2a and 2b. The first output terminal 3a is connected to a connection node between the first and fourth elements 4a and 4d, and the second output terminal 3b is connected to a connection node between the second and third elements 4b and 4c.

The first element 4a is an inductor with an inductance of 2.521 nH. The second element 4b is an inductor with an inductance of 76.157 nH. The third element 4c is an inductor with an inductance of 1.907 nH. And the fourth element 4d is a capacitor with a capacitance of 1.429 pF.

When the circuit is designed, a number of element configurations other than the ones shown in FIGS. 20, 21 and 22 should be obtained as solutions. However, as already described for the first specific example, an element configuration with a large relative band needs to be selected to minimize the deterioration of the transmission and receiving properties when a cellphone is used. In addition, as also can be seen from FIGS. 8 and 10, the higher the frequency band, the more significantly the band changes when a portion of a human body comes close to the mobile terminal. For that reason, a circuit configuration that will have its relative band expanded in the radio frequency band is preferably selected in conclusion.

From these viewpoints, the circuit configurations shown in FIGS. 20, 21 and 22 were extracted from the lot of solutions derived.

It should be noted that if the impedance of an antenna for use in the present invention varied at each frequency due to the change of the structures or dimensions of the antenna, the element constant values shown in FIGS. 20 to 22 could also change. However, if two frequencies at which the antenna operates are given, then the structure and dimensions of the antenna that can be used in the present invention are substantially determined. For that reason, the structure and dimensions of the antenna that can be used in practice according to the present invention never deviate significantly from the structure and dimensions of the antenna selected according to the frequency and shown in one of FIGS. 14 to 16. As a result, the impedances of the antenna at the two frequencies can also be close to the values described above.

Even if an antenna that has a different structure or different dimensions from the one shown in FIG. 14, 15 or 16 is used, the element constants to be figured out will never deviate significantly from the values shown in FIGS. 20 to 22 unless a big difference is produced between the impedances of the antenna at the two frequencies described above. For example, even if the impedances of the antenna at the two frequencies have changed to a certain degree due to a variation in the dimensions of the antenna, the dual-frequency matching circuit with the element constants shown in FIGS. 20 to 22 can still achieve the effects of the present invention sufficiently.

Stated otherwise, in a situation where the impedance of the antenna is equal to the value of the specific example described above, even if the respective values of element constants do not exactly match the ones shown in FIGS. 20 to 22, the effects of the present invention can still be achieved. For example, even if the respective values of the element constants have varied by about 50% from the ones shown in FIG. 6, the effects of the present invention can still be achieved.

A dual-frequency matching circuit according to the present invention is made up of as small as four elements, and therefore, causes little loss and achieves high stability with respect to a variation in the impedance of a load. That is why the dual-frequency matching circuit of the present invention can be used effectively in an amplifier or a mixer, for example. The present invention is also applicable to a tuned circuit for use in a plasma generation source for a thin-film deposition system that deposits a thin film on a substrate by a physical or chemical process and to a tuned circuit for a magnetron for use in a microwave oven for heating with microwaves.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A dual-frequency matching circuit comprising:
   first and second input terminals that receive a first RF signal with a frequency of 0.85 GHz and a second RF signal with a frequency of 2.05 GHz, respectively, from an RF circuit with an impedance of 50 Ω;
   first and second output terminals that are connected to an antenna; and
   a group of circuit elements that are connected between the input terminals and the output terminals,
   wherein the group of circuit elements includes first, second, third and fourth elements, and
   wherein the first and fourth elements are connected in series between the first and second input terminals and the second and third elements are connected in series between the first and second input terminals,
   wherein the first output terminal is connected to a connection node between the first and fourth elements, and
   wherein the second output terminal is connected to a connection node between the second and third elements, and
   wherein the first element is an inductor with an inductance of 2.521 nH, and
   wherein the second element is an inductor with an inductance of 76.157 nH, and
   wherein the third element is an inductor with an inductance of 1.907 nH, and
   wherein the fourth element is a capacitor with a capacitance of 1.429 pF.

2. The dual-frequency matching circuit of claim 1, wherein the impedance of the antenna is 54.4−8.3i Ω (where i is an imaginary unit) at a frequency of 0.85 GHz and 50.4+8.2i Ω (where i is an imaginary unit) at a frequency of 2.05 GHz, respectively.

3. The dual-frequency matching circuit of claim 2, wherein the antenna is an inverted F antenna to be built in a cellphone.

* * * * *

UNITED STATES PATENT AND TRADEMARK OFFICE
CERTIFICATE OF CORRECTION

PATENT NO. : 7,573,352 B2  Page 1 of 1
APPLICATION NO. : 12/352331
DATED : August 11, 2009
INVENTOR(S) : Ushio Sangawa It is certified that error appears in the above-identified patent and that said Letters Patent is hereby corrected as shown below:

On Page 2 of the title page of the patent, under Item "(56) References Cited", under "OTHER PUBLICATIONS", change "PCT/JP20081002348" to --PCT/JP2008/002348--.

In Column 7, Lines 13-19, change

" $\alpha_j(f) = \begin{cases} -\dfrac{1}{(2\pi f) C_j} & (\text{capacitor}) \\ (2\pi f) L_j & (\text{inductor}) \end{cases}, \quad (j = 1, 2, 3, 4)$ "

to

-- $\alpha_j(f) = \begin{cases} -\dfrac{1}{(2\pi f) C_j} & (\text{capacitor}) \\ (2\pi f) L_j & (\text{inductor}) \end{cases}, \quad (j = 1, 2, 3, 4) \qquad (1)$ --.

Signed and Sealed this

Second Day of February, 2010

David J. Kappos
*Director of the United States Patent and Trademark Office*